(12) United States Patent
Seo et al.

(10) Patent No.: US 9,647,228 B2
(45) Date of Patent: May 9, 2017

(54) LIGHT-EMITTING ELEMENT AND LIGHT-EMITTING DEVICE

(75) Inventors: Hiromi Seo, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 656 days.

(21) Appl. No.: 13/468,533

(22) Filed: May 10, 2012

(65) Prior Publication Data

US 2012/0286252 A1 Nov. 15, 2012

(30) Foreign Application Priority Data

May 13, 2011 (JP) .................................. 2011-108559
Jun. 1, 2011 (JP) .................................. 2011-123451

(51) Int. Cl.
*H01L 51/54* (2006.01)
*H01L 51/50* (2006.01)
*H01L 51/52* (2006.01)

(52) U.S. Cl.
CPC ........ *H01L 51/506* (2013.01); *H01L 51/5278* (2013.01); *H01L 2251/55* (2013.01)

(58) Field of Classification Search
None
See application file for complete search history.

(56) References Cited

U.S. PATENT DOCUMENTS

| | | | |
|---|---|---|---|
| 5,989,737 A | 11/1999 | Xie et al. |
| 6,013,384 A | 1/2000 | Kido et al. |
| 6,172,459 B1 | 1/2001 | Hung et al. |
| 6,361,886 B2 | 3/2002 | Shi et al. |
| 6,423,429 B2 | 7/2002 | Kido et al. |
| 6,486,601 B1 | 11/2002 | Sakai et al. |
| 6,589,673 B1 | 7/2003 | Kido et al. |
| 6,830,829 B2 | 12/2004 | Suzuki et al. |
| 6,936,961 B2 | 8/2005 | Liao et al. |
| 6,994,922 B2 | 2/2006 | Suzuki et al. |
| 7,158,161 B2 | 1/2007 | Gyoutoku et al. |
| 7,598,670 B2 | 10/2009 | Kumaki et al. |
| 7,605,534 B2 | 10/2009 | Yamazaki et al. |
| 7,646,010 B2 | 1/2010 | Kawakami et al. |
| 7,649,197 B2 | 1/2010 | Iwaki et al. |
| 7,732,808 B2 | 6/2010 | Ikeda et al. |
| 7,790,296 B2 | 9/2010 | Kawakami et al. |
| 7,883,788 B2 | 2/2011 | Kawakami et al. |
| 7,893,427 B2 | 2/2011 | Kumaki et al. |
| 7,977,865 B2 | 7/2011 | Suzuki et al. |
| 7,985,974 B2 | 7/2011 | Nowatari et al. |
| 7,989,802 B2 | 8/2011 | Nagao et al. |
| 8,017,252 B2 | 9/2011 | Iwaki et al. |
| 8,048,543 B2 | 11/2011 | Kawakami et al. |
| 8,080,934 B2 | 12/2011 | Kido et al. |
| 8,227,982 B2 | 7/2012 | Iwaki et al. |
| 8,252,434 B2 | 8/2012 | Iwaki et al. |
| 8,405,070 B2 | 3/2013 | Iwaki et al. |
| 8,421,346 B2 | 4/2013 | Osaka et al. |
| 8,482,193 B2 | 7/2013 | Kido et al. |
| 9,070,892 B2 | 6/2015 | Kido |
| 9,099,682 B2 | 8/2015 | Nowatari et al. |
| 2001/0046611 A1 | 11/2001 | Kido et al. |
| 2002/0180349 A1 | 12/2002 | Aziz et al. |
| 2003/0111666 A1 | 6/2003 | Nishi et al. |
| 2003/0189401 A1 | 10/2003 | Kido et al. |
| 2004/0227460 A1 | 11/2004 | Liao et al. |
| 2005/0025993 A1 | 2/2005 | Thompson et al. |
| 2005/0064240 A1 | 3/2005 | Mishima et al. |
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2005/0106419 A1 | 5/2005 | Endoh et al. |
| 2005/0116633 A1 | 6/2005 | Yamazaki et al. |
| 2005/0170208 A1 | 8/2005 | Yatsunami et al. |
| 2005/0218396 A1 | 10/2005 | Tsuchiya et al. |
| 2005/0248267 A1 | 11/2005 | Gyoutoku et al. |

(Continued)

FOREIGN PATENT DOCUMENTS

EP 1 351 558 A1 10/2003
EP 2 128 217 A1 12/2009

(Continued)

OTHER PUBLICATIONS

Machine translation of JP2002-343576. Date of publication: Nov. 29, 2002.*
Yang, Y. et al, "Polyaniline as a Transparent Electrode for Polymer Light-Emitting Diodes: Lower Operating Voltage and Higher Efficiency," Applied Physics Letters, vol. 64, No. 10, Mar. 7, 1994, pp. 1245-1247.
Tokito, S. et al., "Metal Oxides as a Hole-Injecting Layer for an Organic Electroluminescent Device," Journal of Physics D: Applied Physics, 1996, vol. 29, No. 11, pp. 2750-2753.
Tao, S. et al., "Anthracene Derivative for a Non-Doped Blue-Emitting Organic Electroluminescence Device with Both Excellent Color Purity and High Efficiency," Chemical Physics Letters, 2004, vol. 297, pp. 1-4.
Taiwanese Office Action re Application No. TW 101116219, dated Apr. 21, 2016.

*Primary Examiner* — Andrew K Bohaty
(74) *Attorney, Agent, or Firm* — Husch Blackwell LLP

(57) ABSTRACT

Provided are a light-emitting element capable of reducing power consumption by increasing its light extraction efficiency and a light-emitting device using the light-emitting element. A light-emitting element includes a composite material, which contains an organic compound having a high hole-transport property and an electron acceptor and in which the spin density measured by an electron spin resonance (ESR) method is less than or equal to $1 \times 10^{19}$ spins/$cm^3$, the spin density is less than or equal to $3 \times 10^{19}$ spins/$cm^3$ when the molar ratio of the electron acceptor to the organic compound is greater than or equal to 1, or the spin density is less than or equal to $5 \times 10^{19}$ spins/$cm^3$ when the molar ratio is greater than or equal to 2.

16 Claims, 19 Drawing Sheets

(56) References Cited

U.S. PATENT DOCUMENTS

| | | |
|---|---|---|
| 2006/0008740 A1 | 1/2006 | Kido et al. |
| 2006/0292394 A1* | 12/2006 | Iwaki et al. ............... 428/690 |
| 2007/0007516 A1 | 1/2007 | Seo et al. |
| 2007/0042221 A1 | 2/2007 | Kawamura |
| 2007/0049778 A1 | 3/2007 | Nomura et al. |
| 2007/0172699 A1 | 7/2007 | Nakashima et al. |
| 2007/0182317 A1 | 8/2007 | Kido et al. |
| 2007/0200125 A1 | 8/2007 | Ikeda et al. |
| 2007/0290604 A1 | 12/2007 | Sakanoue et al. |
| 2008/0191611 A1 | 8/2008 | Iwaki et al. |
| 2008/0309222 A1 | 12/2008 | Thompson et al. |
| 2009/0026922 A1 | 1/2009 | Iwaki et al. |
| 2009/0165854 A1 | 7/2009 | Yamazaki et al. |
| 2009/0230847 A1 | 9/2009 | Iwaki et al. |
| 2010/0038634 A1 | 2/2010 | Nagao et al. |
| 2010/0096627 A1 | 4/2010 | Ikeda et al. |
| 2010/0207518 A1 | 8/2010 | Ikeda et al. |
| 2010/0301382 A1 | 12/2010 | Shitagaki et al. |
| 2010/0301383 A1 | 12/2010 | Shitagaki et al. |
| 2011/0031476 A1 | 2/2011 | Oda et al. |
| 2011/0057178 A1 | 3/2011 | Shitagaki et al. |
| 2011/0057179 A1 | 3/2011 | Nowatari et al. |
| 2011/0114928 A1 | 5/2011 | Suzuki et al. |
| 2011/0127510 A1 | 6/2011 | Seo et al. |
| 2012/0080667 A1* | 4/2012 | Nowatari ............... C09K 11/06 257/40 |
| 2012/0132895 A1 | 5/2012 | Kido et al. |
| 2012/0133276 A1 | 5/2012 | Thompson et al. |
| 2012/0241727 A1* | 9/2012 | Ogita et al. ................ 257/40 |
| 2015/0249230 A1 | 9/2015 | Kido |
| 2015/0333270 A1 | 11/2015 | Nowatari et al. |

FOREIGN PATENT DOCUMENTS

| | | | |
|---|---|---|---|
| EP | 2 284 921 A2 | 2/2011 | |
| JP | 02-288092 A | 11/1990 | |
| JP | 3-274695 | 12/1991 | |
| JP | 9-63771 | 3/1997 | |
| JP | 10-255985 A | 9/1998 | |
| JP | 11-307259 | 11/1999 | |
| JP | 11-307264 A | 11/1999 | |
| JP | 2002343576 A * | 11/2002 | ............ H05B 33/22 |
| JP | 2003-272860 | 9/2003 | |
| JP | 2005-26121 | 1/2005 | |
| JP | 2005-190998 | 7/2005 | |
| JP | 2005-251587 A | 9/2005 | |
| JP | 2007-036188 A | 2/2007 | |
| JP | 2007-048528 A | 2/2007 | |
| JP | 2007-048529 A | 2/2007 | |
| JP | 2007-048530 A | 2/2007 | |
| JP | 2007-63501 | 3/2007 | |
| JP | 2007-180526 A | 7/2007 | |
| JP | 2007-335737 | 12/2007 | |
| JP | 2011-9729 | 1/2011 | |
| JP | 2011-034917 A | 2/2011 | |
| JP | 2011-77032 | 4/2011 | |
| JP | 2011-077034 A | 4/2011 | |
| TW | 200306762 | 11/2003 | |
| TW | 200704638 | 2/2007 | |
| WO | WO 2008/108256 A1 | 9/2008 | |
| WO | WO 2010/137509 A1 | 12/2010 | |
| WO | WO 2011/027653 A1 | 3/2011 | |
| WO | WO 2011/027657 A1 | 3/2011 | |

* cited by examiner

LIGHT-EMITTING ELEMENT AND LIGHT-EMITTING DEVICE

BACKGROUND OF THE INVENTION

1. Field of the Invention

The present invention relates to a light-emitting element having an EL layer between a pair of electrodes. Further, the present invention relates to a light-emitting device using the light-emitting element.

2. Description of the Related Art

Since light-emitting elements having an EL layer between a pair of electrodes are self-emission elements, high visibility can be achieved, they can be suitably used for thinner devices in that backlights needed for liquid crystal display devices (LCDs) are unnecessary, and the viewing angle has no limits. Thus, display devices using light-emitting elements have attracted attention as an alternative to CRTs or LCDs and have been increasingly put into practical use. Furthermore, light-emitting elements are thin planar light sources, and fewer limitations are imposed on their shapes. Thus, lighting devices having light-emitting elements as light sources have been expected to find new applications, as well as to replace conventional lighting devices using filament lamps, incandescent lamps, LEDs, and the like.

In order to increase the luminance of a light-emitting element, the amount of current supplied to the light-emitting element is increased. However, a larger amount of current supplied to a light-emitting element accelerates the deterioration of an EL layer, which reduces the lifetime of the light-emitting element. In view of this, Patent Document 1 given below discloses a structure of a light-emissive element in which light-emissive units having light-emissive layers are stacked between an anode and a cathode and a charge generation layer is provided between the units. With this structure, the luminance of the light-emissive elements can be increased while an increase in the amount of current supplied to light-emissive layers is suppressed.

REFERENCE

[Patent Document 1] Japanese Published Patent Application No. 2003-272860

SUMMARY OF THE INVENTION

Specifically, according to Patent Document 1, the charge generation layer contains a mixture or laminated layer including an organic compound having an ionization potential less than 5.7 eV and an electron-donating property, and an inorganic or organic substance capable of forming a charge-transfer complex through the oxidation-reduction reaction thereof with the organic compound. Further, according to the document, formation of a charge-transfer complex through an oxidation-reduction reaction is an important factor to ensure charge transfer upon voltage application; charges in the charge-transfer complex are transferred toward an anode or a cathode when a voltage is applied between the anode and the cathode, so that, from the charge generation layer having an electrically insulating property, a hole can be injected into the light-emissive unit which is located on the cathode side of the charge generation layer and an electron can be injected into the light-emissive unit which is located on the anode side of the charge generation layer.

Further, according to Patent Document 1, a newly-observed absorption spectrum peak in a near-infrared region of 800 nm to 2000 nm, which is shown by the charge generation layer, indicates formation of a charge-transfer complex. However, as apparent from the absorption spectra shown in FIG. 5, FIG. 6, and FIG. 7 of Patent Document 1, the absorption spectrum of the charge generation layer considered to include a charge-transfer complex also shows a new peak in a visible light region of 300 nm to 600 nm, in addition to the peak in the near-infrared region. That means that the above charge generation layer absorbs light having a wavelength in the visible light region, which indicates that the charge-transfer complex included in the charge generation layer is one cause for a reduction in the extraction efficiency of light from the light-emissive element.

In view of the foregoing technical background, an object of one embodiment of the present invention is to provide a light-emitting element capable of reducing power consumption by increasing its light extraction efficiency and a light-emitting device using the light-emitting element.

The present inventors have considered that the hole-injection property of a composite material containing an organic compound and a substance having an electron-accepting property with respect to the organic compound (hereinafter, referred to as electron acceptor) is not attributed to the charge-transfer complex formed through an oxidation-reduction reaction. In accordance with one embodiment of the present invention, even when a charge-transfer complex is not formed between the organic compound and the electron acceptor through the oxidation-reduction reaction, the excellent hole injection property can be ensured in such a way that holes generated through extraction of electrons from the organic compound by the electron acceptor on voltage application are injected from a layer containing the composite material into an adjacent layer.

Specifically, in accordance with one embodiment of the present invention, a light-emitting element includes a composite material, which contains an organic compound having a high hole-transport property and an electron acceptor and in which the spin density measured by an electron spin resonance (ESR) method is less than or equal to $1\times10^{19}$ spins/cm$^3$, in which the spin density is less than or equal to $3\times10^{19}$ spins/cm$^3$ when the molar ratio of the electron acceptor to the organic compound is greater than or equal to 1, or in which the spin density is less than or equal to $5\times10^{19}$ spins/cm$^3$ when the molar ratio is greater than or equal to 2.

The spin density in the composite material which falls within the above range means that the number of unpaired electrons generated by charge-transfer interaction is small in the composite material, i.e., charge-transfer interaction does not occur easily in the composite material.

Note that the ionization potential of the organic compound included in the above composite material is preferably 5.7 eV or more. This is because an ionization potential of 5.7 eV or more of the organic compound is preferable for reduction in spin density.

Unlike in Patent Document 1, a composite material in which charge-transfer interaction does not occur easily between the organic compound and the electron acceptor is used in one embodiment of the present invention. Accordingly, the 300 nm to 600 nm wavelength light absorbed by a layer containing the above composite material due to charge-transfer interaction can be reduced, so that the transmittance of this layer for visible light having a wavelength of 360 nm to 830 nm can be increased.

Note that the organic compound having a high hole-transport property is an organic compound selected from among organic compounds such as low molecular compounds and high molecular compounds (e.g., oligomers, dendrimers, and polymers), which has a property of transporting more holes than electrons, and preferably, the organic compound has a hole mobility of $10^{-6}$ cm$^2$/Vs or more. As examples of the organic compound which has a high hole-transport property and does not easily undergo charge-transfer interaction with the electron acceptor, the following substances can be specifically given: 1,3,5-tri(dibenzothiophen-4-yl)benzene (abbreviation: DBT3P-II), 9-[3,5-di(phenanthren-9-yl)phenyl]phenanthrene (abbreviation: Pn3P), 1-[3,5-di(naphthalen-1-yl)phenyl]naphthalene (abbreviation: N3P), 1,2,3,4-tetraphenylnaphthalene (abbreviation: P4N), and 1,3,5-tri(dibenzofuran-4-yl) benzene (abbreviation: DBF3P-II).

Examples of the above electron acceptor are 7,7,8,8-tetracyano-2,3,5,6-tetrafluoroquinodimethane (abbreviation: F$_4$-TCNQ), chloranil, and oxides of transition metals. Other examples are oxides of metals that belong to Groups 4 to 8 in the periodic table. Specific examples of such oxides are vanadium oxide, niobium oxide, tantalum oxide, chromium oxide, molybdenum oxide, tungsten oxide, manganese oxide, rhenium oxide, and the like.

Specifically, a light-emitting element in accordance with one embodiment of the present invention includes at least one EL layer and a pair of electrodes between which the EL layer is provided. The EL layer contains a composite material which includes an organic compound and an electron acceptor. In the above composite material, the spin density measured by an ESR method is less than or equal to $1 \times 10^{19}$ spins/cm$^3$; alternatively, the spin density is less than or equal to $3 \times 10^{19}$ spins/cm$^3$ when the molar ratio of the electron acceptor to the organic compound is greater than or equal to 1, or the spin density is less than or equal to $5 \times 10^{19}$ spins/cm$^3$ when the molar ratio is greater than or equal to 2.

A light-emitting element in accordance with one embodiment of the present invention includes at least one charge generation layer, a plurality of stacked EL layers between which the charge generation layer is provided, and a pair of electrodes between which the charge generation layer and the plurality of EL layers are provided. Any one of the charge generation layer and the plurality of EL layers contains a composite material which includes an organic compound and an electron acceptor. In the above composite material, the spin density measured by an ESR method is less than or equal to $1 \times 10^{19}$ spins/cm$^3$; alternatively, the spin density is less than or equal to $3 \times 10^{19}$ spins/cm$^3$ when the molar ratio of the electron acceptor to the organic compound is greater than or equal to 1, or the spin density is less than or equal to $5 \times 10^{19}$ spins/cm$^3$ when the molar ratio is greater than or equal to 2.

In accordance with one embodiment of the present invention, a composite material having high visible light transmittance is used for a light-emitting element, so that the extraction efficiency of light from the light-emitting element can be increased. Thus, a light-emitting element capable of reducing power consumption and exhibiting high luminance and a light-emitting device using the light-emitting element can be provided.

BRIEF DESCRIPTION OF THE DRAWINGS

In the accompanying drawings.

DETAILED DESCRIPTION OF THE INVENTION

Embodiments will be described with reference to drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

The category of a light-emitting device of the present invention includes a display device having a light-emitting element in each pixel, a lighting device using a light-emitting element as a light source, and the like. The category of such a display device includes a panel in which a light-emitting element is included and a module in which an integrated circuit such as a controller is mounted on the panel.

Embodiment 1

A light-emitting element in accordance with one embodiment of the present invention includes at least one EL layer and a pair of electrodes between which the EL layer is provided. The EL layer contains a composite material which includes an organic compound having a high hole-transport property and an electron acceptor and in which charge-transfer interaction does not occur easily.

Figure 1:
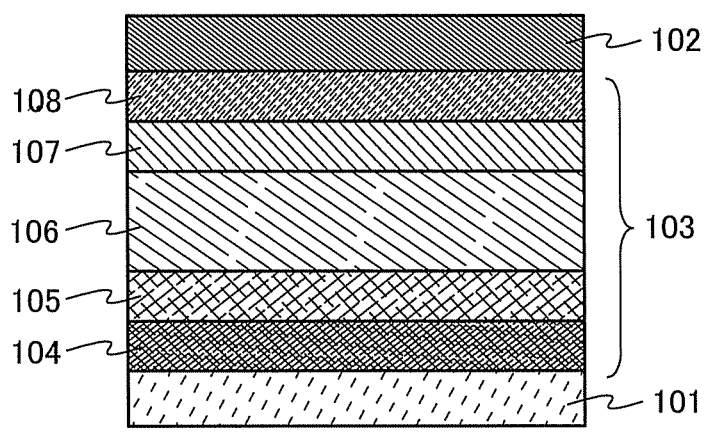
FIG. 1 illustrates a structure of a light-emitting element.

FIG. 1 illustrates a structure example of the light-emitting element in accordance with one embodiment of the present invention. The light-emitting element illustrated in FIG. 1 includes an anode 101 and a cathode 102, which correspond to the pair of electrodes, and an EL layer 103 provided between the anode 101 and the cathode 102.

In the example in FIG. 1, the EL layer 103 includes a hole-injection layer 104, a hole-transport layer 105, a light-emitting layer 106, an electron-transport layer 107, an electron-injection layer 108, and the like. Specifically, the hole-injection layer 104, the hole-transport layer 105, the light-emitting layer 106, the electron-transport layer 107, the electron-injection layer 108, and the cathode 102 are sequentially stacked over the anode 101.

In the light-emitting element illustrated in FIG. 1, a composite material of an organic compound having a high hole-transport property and an electron acceptor is used for the hole-injection layer 104. In this composite material, charge-transfer interaction does not occur easily between the organic compound and the electron acceptor and the number of unpaired electrons generated by charge-transfer interaction is small accordingly. Specifically, in this composite material, the spin density measured by an ESR method is less than or equal to $1 \times 10^{19}$ spins/cm$^3$; alternatively, the spin density is less than or equal to $3 \times 10^{19}$ spins/cm$^3$ when the molar ratio of the electron acceptor to the organic compound is greater than or equal to 1, or the spin density is less than or equal to $5 \times 10^{19}$ spins/cm$^3$ when the molar ratio is greater than or equal to 2.

The above-described organic compound, which is selected from among organic compounds such as low molecular compounds and high molecular compounds (e.g., oligomers, dendrimers, and polymers), has a property of transporting more holes than electrons, and preferably, the organic compound has a hole mobility of $10^{-6}$ cm$^2$/Vs or more and does not easily undergo charge-transfer interaction with the electron acceptor. In order to transport holes, a condensed aromatic compound or a condensed heteroaromatic compound is preferred. In order not to undergo charge-transfer interaction easily, a condensed aromatic compound (e.g., naphthalene or phenanthrene) or a condensed heteroaromatic compound (e.g., dibenzothiophene or dibenzofuran), which does not have a nitrogen atom, is more preferred. However, there is no such limitation as long as a spin density in the above-described range can be obtained.

Specific examples of the organic compound that can be used for the composite material are 1,3,5-tri(dibenzothiophen-4-yl)benzene (abbreviation: DBT3P-II), 9-[3,5-di(phenanthren-9-yl)phenyl]phenanthrene (abbreviation: Pn3P), 1-[3,5-di(naphthalen-1-yl)phenyl]naphthalene (abbreviation: N3P), 1,2,3,4-tetraphenylnaphthalene (abbreviation: P4N), 1,3,5-tri(dibenzofuran-4-yl) benzene (abbreviation: DBF3P-II), and the like. These organic compounds have an ionization potential of 5.7 eV or more.

Specific examples of the above electron acceptor are 7,7,8,8-tetracyano-2,3,5,6-tetrafluoroquinodimethane (abbreviation: F$_4$-TCNQ), chloranil, and oxides of transition metals. Other examples are oxides of metals that belong to Groups 4 to 8 in the periodic table. Specific examples of such oxides are vanadium oxide, niobium oxide, tantalum oxide, chromium oxide, molybdenum oxide, tungsten oxide, manganese oxide, rhenium oxide, and the like.

When a voltage is applied between the anode 101 and the cathode 102 so that the potential of the anode 101 can be higher than that of the cathode 102, in the hole-injection layer 104 containing the above composite material, electrons are extracted from the organic compound by the electron acceptor and thus holes are generated. Then, the generated holes are injected from the hole-injection layer 104 into the light-emitting layer 106 through the hole-transport layer 105.

In one embodiment of the present invention, since the hole-injection layer 104 contains the composite material in which charge-transfer interaction does not occur easily between the organic compound having a high hole-transport property and the electron acceptor, the 300 nm to 600 nm wavelength light absorbed by the hole-injection layer 104 due to charge-transfer interaction can be reduced. Accordingly, the transmittance of the hole-injection layer 104 for visible light having a wavelength of 360 nm to 830 nm can be increased. Thus, in one embodiment of the present invention, the extraction efficiency of light from the light-emitting element can be increased, so that a light-emitting element capable of reducing power consumption and exhibiting high luminance and a light-emitting device using the light-emitting element can be provided.

A specific example in which the light-emitting element described in this embodiment is manufactured is described.

For the anode 101 and the cathode 102, any of metals, alloys, electrically conductive compounds, and mixtures thereof, and the like can be used. Specifically, it is possible to use indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), titanium (Ti), an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, or the like. Note that the anode 101 and the cathode 102 can be formed by, for example, a sputtering method, an evaporation method (including a vacuum evaporation method), or the like.

As the substance having a high hole-transport property used for the hole-transport layer 105, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. In addition, the following carbazole derivatives and the like can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA). The substances mentioned here are mainly ones that have a hole mobility of $10^{-6}$ cm$^2$/Vs or more. Further, other than these substances, a substance that has a property of transporting more holes than electrons may be used.

For the hole-transport layer 105, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

The light-emitting layer 106 is a layer containing a light-emitting substance. The light-emitting layer 106 may be formed with a film containing only a light-emitting substance or a film in which an emission center substance is dispersed into a host material.

There is no particular limitation on a material that can be used as the above light-emitting substance or the emission center substance in the light-emitting layer 106, and light emitted from the material may be either fluorescence or phosphorescence. Examples of the above light-emitting substance or emission center substance include the following substances: fluorescent substances such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-c]fluoranthene-3,10-diamine (abbreviation: p-mPhAFD), 2-{2-isopropyl-6-[2-(1,1,7,7-tetramethyl-2,3,6,7-tetrahydro-1H,5H-benzo quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and phosphorescent substances such as bis[2-(3',5'-bistrifluoromethylphenyl)pyridinato-N,C$^{2'}$]iridium(III) picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIracac), tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), bis[2-(2'-benzo[4,5-α]thienyl)pyridinato-N,C$^{3'}$]iridium(III) (acetylacetonate) (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphine platinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Although there is no particular limitation on a material that can be used as the host material into which an emission center substance described above is to be dispersed; any of the following substances can be used for the host material, for example: metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc (II) (abbreviation: ZnPBO), and bis(2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be given, and specific examples are 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like.

For use as the host material, one or more substances having a wider energy gap than the emission center substance described above is preferably selected from these substances and known substances. Moreover, in the case where the emission center substance emits phosphorescence, a substance having triplet excitation energy (energy difference between a ground state and a triplet excited state) which is higher than that of the emission center substance is preferably selected as the host material.

Note that the light-emitting layer 106 can also be a stack of two or more layers. For example, in the case where the light-emitting layer 106 is formed by stacking a first light-emitting layer and a second light-emitting layer in that order over the hole-transport layer 105, a substance having a hole-transport property is used for the host material of the first light-emitting layer and a substance having an electron-transport property is used for the host material of the second light-emitting layer. A stack of light-emitting layers containing different light-emitting substances or different emission center substances may also be used.

The electron-transport layer 107 is a layer containing a substance having a high electron-transport property. For the electron-transport layer 107, it is possible to use a metal complex such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, $Zn(BOX)_2$, or bis[2-(2-hydroxyphenyl)benzothiazolato]zinc (abbreviation: $Zn(BTZ)_2$). It is also possible to use a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs). It is also possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy). The substances mentioned here mainly have an electron mobility of $10^{-6}$ $cm^2/Vs$ or more. Note that other than these substances, a substance that has a property of transporting more electrons than holes may be used for the electron-transport layer.

Furthermore, the electron-transport layer is not limited to a single layer and may be a stack of two or more layers containing any of the above substances.

The electron-injection layer 108 is a layer containing a substance having a high electron-injection property. For the electron-injection layer 108, an alkali metal, an alkaline earth metal, or a compound thereof such as lithium fluoride (LiF), cesium fluoride (CsF), calcium fluoride ($CaF_2$), or lithium oxide ($LiO_x$) can be used. Alternatively, a rare earth metal compound such as erbium fluoride ($ErF_3$) can be used. Any of the above substances for forming the electron-transport layer 107 can also be used.

For the electron-injection layer 108, a composite material in which an organic compound and a substance having an electron-donating property (hereinafter, referred to as electron donor) are mixed may be used. The electron donor causes electron generation in the organic compound, and thus a composite material is excellent in an electron-injection property and an electron-transport property. The organic compound here is preferably a material excellent in transporting the generated electrons; specific examples include a substance for forming the electron-transport layer 107 (e.g., a metal complex or a heteroaromatic compound), which is described above. The electron donor is preferably a substance showing an electron-donating property with respect to the organic compound. Specifically, an alkali metal, an alkaline earth metal, and a rare earth metal are preferable, and lithium, cesium, magnesium, calcium, erbium, ytterbium, and the like can be given. Alkali metal oxides or alkaline earth metal oxides are also preferable and examples are lithium oxide, calcium oxide, barium oxide, and the like. A Lewis base such as magnesium oxide can also be used. An organic compound such as tetrathiafulvalene (abbreviation: TTF) can also be used.

Note that the hole-injection layer 104, the hole-transport layer 105, the light-emitting layer 106, the electron-transport layer 107, and the electron-injection layer 108 which are mentioned above can each be formed by a method such as an evaporation method (including a vacuum evaporation method), an inkjet method, or a coating method.

In the above-described light-emitting element, current flows due to a potential difference generated between the anode 101 and the cathode 102 and holes and electrons recombine in the EL layer 103, so that light can be emitted. Then, this light emission is extracted to the outside through either the anode 101 or the cathode 102 or both. Therefore, either the anode 101 or the cathode 102, or both, is an electrode having a property of transmitting light.

Embodiment 2

This embodiment shows results of the evaluation of composite materials each including an organic compound having a high hole-transport property and an electron acceptor, using an ESR method.

Samples used for the measurements are described below. All the samples were formed by co-evaporation of an organic compound and an electron acceptor over a quartz substrate having a size of 2.8 mm×20 mm, so that layers formed by the co-evaporation each contained the composite material including the organic compound and the electron acceptor.

The way how the samples were formed is specifically as follows. First, the quartz substrate was fixed to a holder in a vacuum evaporation apparatus so that a surface over which the composite material was to be formed by evaporation faced downward. After the pressure in the vacuum evaporation apparatus was reduced to $10^{-4}$ Pa, the organic compound and molybdenum(VI) oxide, which was an electron acceptor, were co-evaporated, thereby forming a layer containing the composite material over the quartz substrate. For every sample, the thickness of the layer containing the composite material was adjusted to 50 nm. Note that co-evaporation is an evaporation method in which a plurality of different substances is concurrently vaporized from the respective different evaporation sources.

As the organic compounds in the samples, 1,3,5-tri(dibenzothiophen-4-yl)benzene (abbreviation: DBT3P-II), 9-[3,5-di(phenanthren-9-yl)phenyl]phenanthrene (abbreviation: Pn3P), 1-[3,5-di(naphthalen-1-yl)phenyl]naphthalene (abbreviation: N3P), 1,2,3,4-tetraphenylnaphthalene (abbreviation: P4N), and 1,3,5-tri(dibenzofuran-4-yl) benzene (abbreviation: DBF3P-II) were used. For comparison with these samples, samples using composite materials in which charge-transfer interaction is considered to occur easily were also prepared; specifically, NPB and CzPA were used as organic compounds in the samples for comparison. Structural formulae (101) to (107) of the compounds used are illustrated below.

(101)

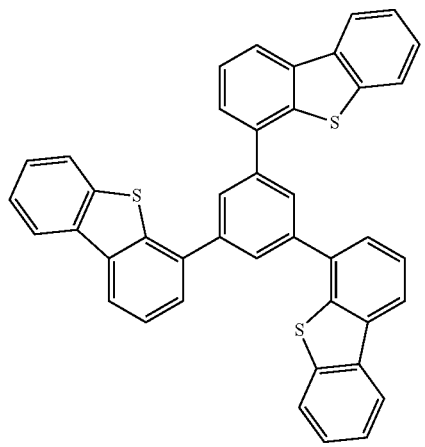

DBT3P-II (102)

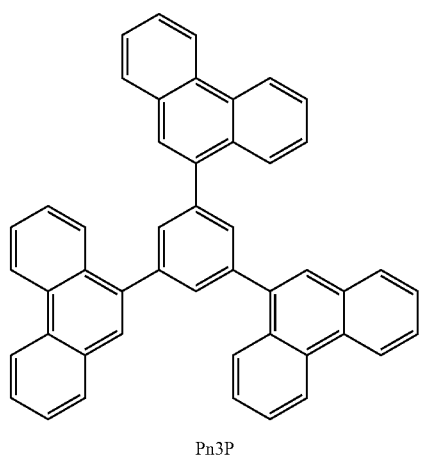

Pn3P (103)

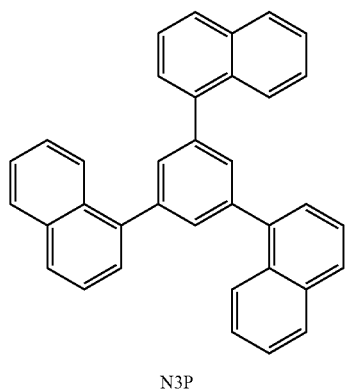

N3P (104)

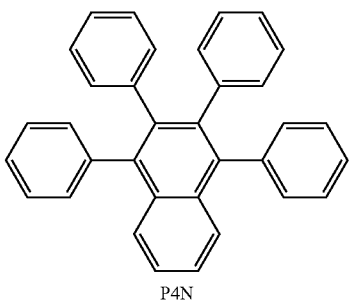

P4N (105)

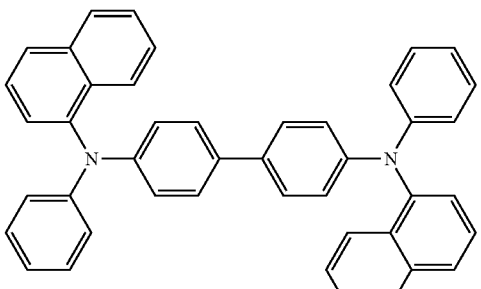

NPB (106)

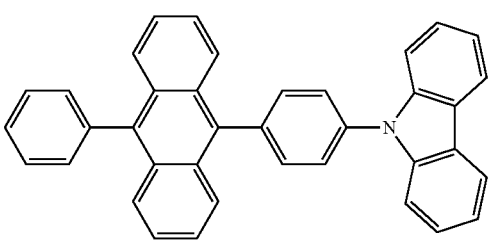

CzPA

-continued

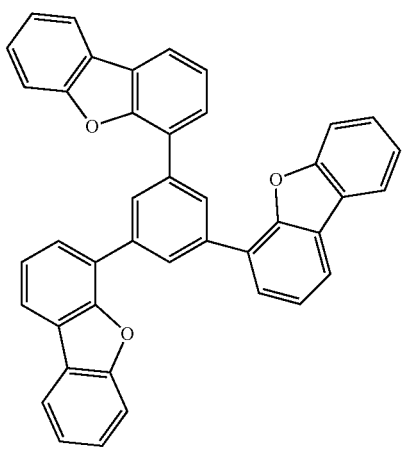

DBF3P-II
(107)

Table 1 below shows the HOMO levels of the organic compounds used in the samples, which were measured using a photoelectron spectrometer (AC-2, product of Riken Keiki Co., Ltd.) by photoelectron spectroscopy.

TABLE 1

| | HOMO level |
|---|---|
| Sample A DBT3P-II | −6.0 |
| Sample B Pn3P | −5.9 |
| Sample C N3P | −5.8 |
| Sample D P4N | −6.0 |
| Sample E DBF3P-II | −6.0 |
| Sample F NPB | −5.4 |
| Sample G CzPA | −5.7 |

Table 2 below shows the HOMO levels of the organic compounds used in the samples A and E, which were measured using a photoelectron spectrometer (AC-3, product of Riken Keiki Co., Ltd.) by photoelectron spectroscopy.

TABLE 2

| | HOMO level |
|---|---|
| Sample A DBT3P-II | −6.2 |
| Sample E DBF3P-II | −6.2 |

The molar ratio of the organic compound to molybdenum oxide in each sample was adjusted with the evaporation rate. The samples using, as the organic compounds, DBT3P-II, Pn3P, N3P, P4N, DBF3P-II, NPB, and CzPA are respectively referred to as sample A, sample B, sample C, sample D, sample E, sample F, and sample G. Table 3 below shows the mass ratio and molar ratio of the organic compound to molybdenum oxide in each sample. Note that in the ESR measurements, four layers including the same organic compound at the same molar ratio were stacked and measured.

TABLE 3

| Sample name (Organic compound name) | Mass ratio (Organic compound:MoOx) | Molar ratio (Organic compound:MoOx) |
|---|---|---|
| Sample A (DBT3P-II) | 4:0.2 | 1:0.215 |
| | 4:0.5 | 1:0.5375 |
| | 4:1 | 1:1.075 |
| | 4:2 | 1:2.15 |

TABLE 3-continued

| Sample name (Organic compound name) | Mass ratio (Organic compound:MoOx) | Molar ratio (Organic compound:MoOx) |
|---|---|---|
| | 4:3 | 1:3.225 |
| | 4:4 | 1:4.3 |
| Sample B (Pn3P) | 4:0.2 | 1:0.21 |
| | 4:0.5 | 1:0.525 |
| | 4:1 | 1:1.05 |
| | 4:2 | 1:2.1 |
| | 4:3 | 1:3.15 |
| | 4:4 | 1:4.2 |
| Sample C (N3P) | 4:0.2 | 1:0.16 |
| | 4:0.5 | 1:0.4 |
| | 4:1 | 1:0.8 |
| | 4:2 | 1:1.6 |
| | 4:3 | 1:2.4 |
| | 4:4 | 1:3.2 |
| Sample D (P4N) | 4:0.5 | 1:0.39 |
| | 4:2 | 1:1.55 |
| | 4:4 | 1:3.1 |
| Sample E (DBF3P-II) | 4:1 | 1:1 |
| | 4:2 | 1:2 |
| | 4:4 | 1:4 |
| Sample F (NPB) | 4:0.2 | 1:0.205 |
| | 4:0.5 | 1:0.5125 |
| | 4:1 | 1:1.025 |
| | 4:2 | 1:2.05 |
| | 4:3 | 1:3.075 |
| | 4:4 | 1:4.1 |
| | 4:5 | 1:5.125 |
| | 4:6 | 1:6.15 |
| Sample G (CzPA) | 4:0.5 | 1:0.425 |
| | 4:1 | 1:0.85 |
| | 4:2 | 1:1.7 |
| | 4:3 | 1:2.55 |
| | 4:4 | 1:3.4 |
| | 4:5 | 1:4.25 |
| | 4:6 | 1:5.1 |

Absorption spectra of the following composite materials were measured: the composite material of DBT3P-II and molybdenum(VI) oxide; the composite material of Pn3P and molybdenum(VI) oxide; the composite material of N3P and molybdenum(VI) oxide; the composite material of P4N and molybdenum(VI) oxide; the composite material of DBF3P-II and molybdenum(VI) oxide; the composite material of NPB and molybdenum(VI) oxide; and the composite material of CzPA and molybdenum(VI) oxide. The weight ratio of the organic compound to molybdenum oxide in each sample was set to 4:2. For every sample, the thickness of the layer containing the composite material was adjusted to 50 nm.

The way how the samples used for the measurements of the absorption spectra were formed is described below. First, the quartz substrate was fixed to a holder in a vacuum evaporation apparatus so that a surface over which the composite material was to be formed by evaporation faced downward. Then, the organic compound (DBT3P-II, Pn3P, N3P, P4N, DBF3P-II, NPB, or CzPA) and molybdenum(VI) oxide were separately put in respective resistance-heating evaporation sources, and in a vacuum state, a layer containing the composite material were formed over the quartz substrate by a co-evaporation method.

Figure 12:
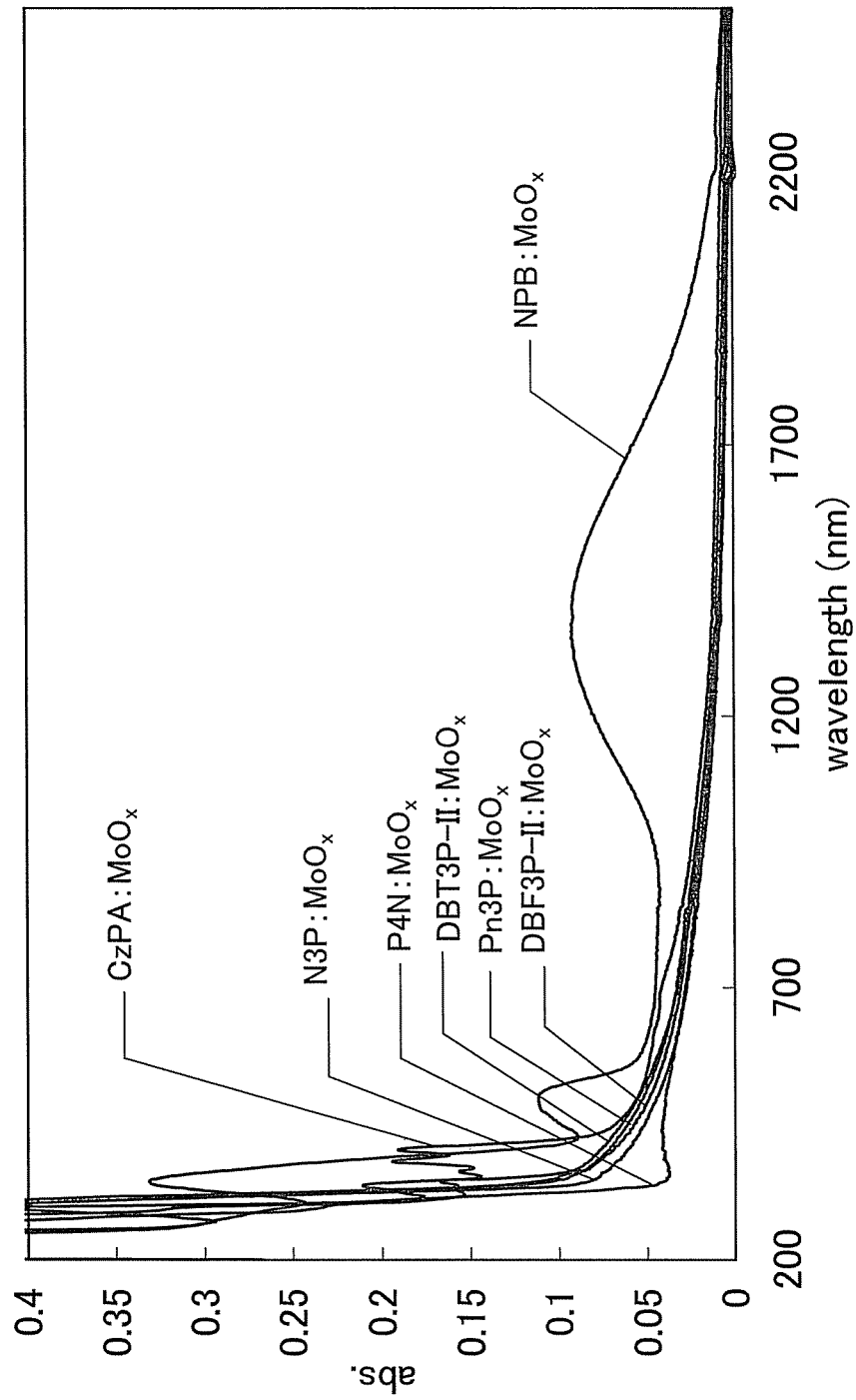
FIG. 12 shows absorption spectra of composite materials.

FIG. 12 shows measurement results of the absorption spectra of the thus formed samples. In addition, FIG. 13 corresponds to an enlarged view of FIG. 12 and shows the absorption spectra in the visible light region at wavelengths of 360 nm to 830 nm. In each of FIG. 12 and FIG. 13, the horizontal axis represents wavelength and the vertical axis represents absorbance. As seen from FIG. 12 and FIG. 13, the sample in which NPB was used as the organic compound in the composite material exhibits a high peak in the wavelength range of 400 nm to 550 nm. In addition, the sample in which CzPA was used as the organic compound in the composite material exhibits a high peak in the wavelength range of 370 nm to 450 nm. In contrast, the samples in which DBT3P-II, Pn3P, N3P, P4N, and DBF3P-II were used as the organic compounds in the composite materials do not exhibit high peaks in the visible light region at wavelengths of 360 nm to 830 nm; the visible light transmittance of these samples were found higher than those of the other two samples.

Measurements of electron spin resonance spectra using an ESR method were performed with an electron spin resonance spectrometer (JES-FA200, manufactured by JEOL Ltd.) under the conditions where the resonance frequency was about 9.4 GHz, the modulation frequency was 100 kHz, the modulation width was 0.6 mT, the time constant was 0.1 sec, the sweep time was 4 min., and the measurement temperature was room temperature. Magnetic field correction was performed with reference to the positions of $Mn^{2+}$ third and fourth signals, and the spin densities were calculated from the peak area of the electron spin resonance spectra obtained by the measurements. Note that the g-values calculated from the peaks of the electron spin resonance spectra are each about 2.00, which corresponds to the g-value of a free electron. Thus, the calculated spin densities each reflect the number of unpaired electrons, and by quantification of the spin densities, the ease of occurrence of charge transfer interaction between the organic compound and the electron acceptor can be indirectly found out.

Figure 2:
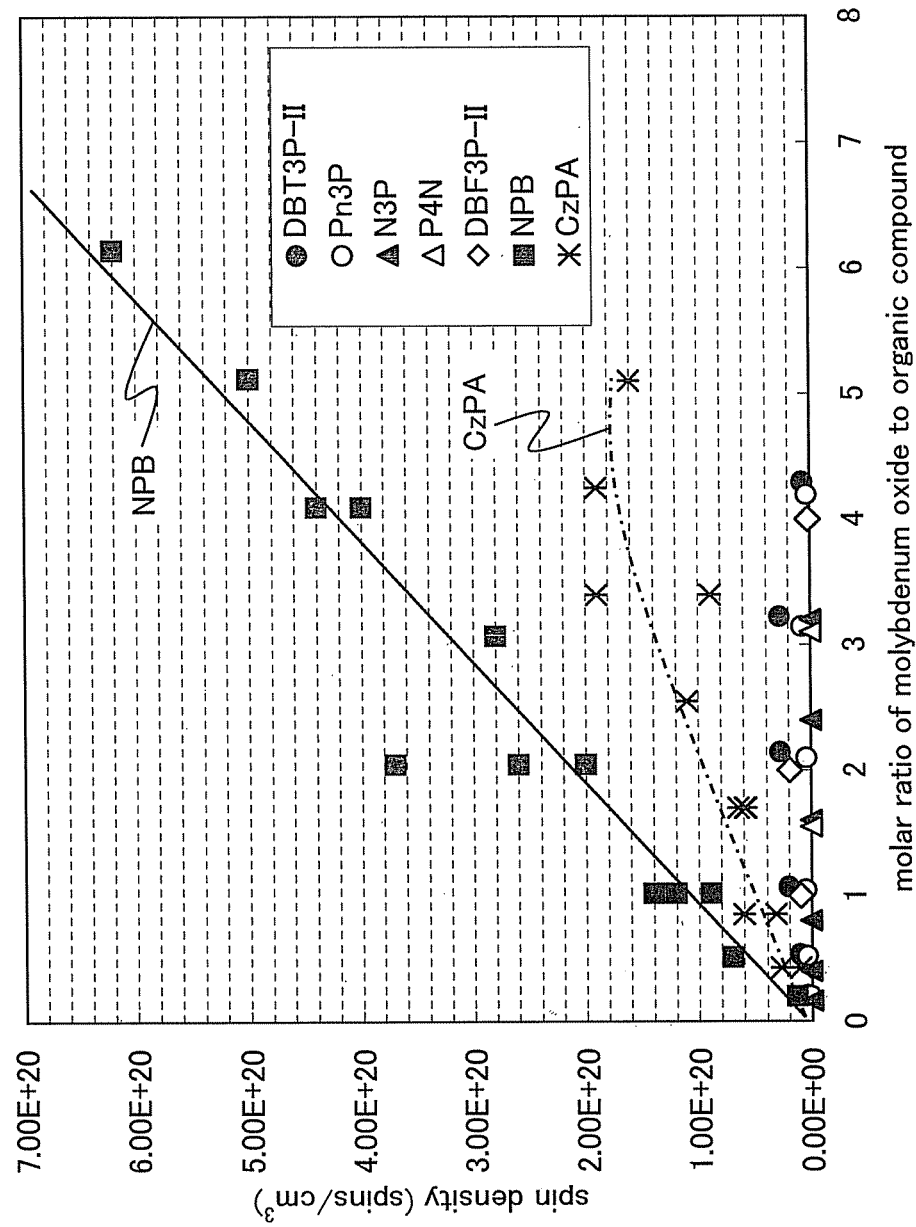
FIG. 2 is a graph showing relations between the molar ratios of molybdenum oxide to organic compounds and spin densities calculated by measurements of electron spin resonance spectra.

FIG. 2 is a graph of relations between the molar ratio of molybdenum oxide to the organic compounds and the spin densities calculated by the measurements of electron spin resonance spectra in the samples. As can be seen from FIG. 2, the spin density of each of the samples A to E exhibits a tendency to increase in the range where the molar ratio of the electron acceptor to the organic compound is 0 to 1. However, although depending on the sample, the spin density is saturated at a molar ratio more than 1, and the spin density does not change in value or exhibits a tendency to decrease in the range where the molar ratio exceeds 3.

In contrast, as seen from FIG. 2, the spin density of each of the samples F and G for comparison exhibits a tendency to increase even in the range where the molar ratio of the electron acceptor to the organic compound exceeds 3. At the same molar ratio, the samples A to E exhibit lower spin densities than the samples F and G. Therefore, the above-described values of the spin densities indicate that the number of unpaired electrons generated by charge-transfer interaction is smaller in the samples A to E than in the samples F and G Further, as can be seen from FIG. 12 and FIG. 13, absorption due to charge-transfer interaction does not occur in the samples A to E but occurs in the samples F and G. Such absorption is large especially in the sample F using NPB whose ionization potential is 5.4 eV.

Therefore, in the light-emitting element in accordance with one embodiment of the present invention, charge-transfer interaction does not occur easily in a layer containing a composite material, such as the samples A to E. Thus, the 300 nm to 600 nm wavelength light absorbed by the layer containing a composite material due to charge-transfer interaction can be reduced, so that the transmittance of this layer for visible light having a wavelength of 360 nm to 830 nm can be increased.

Figure 3:
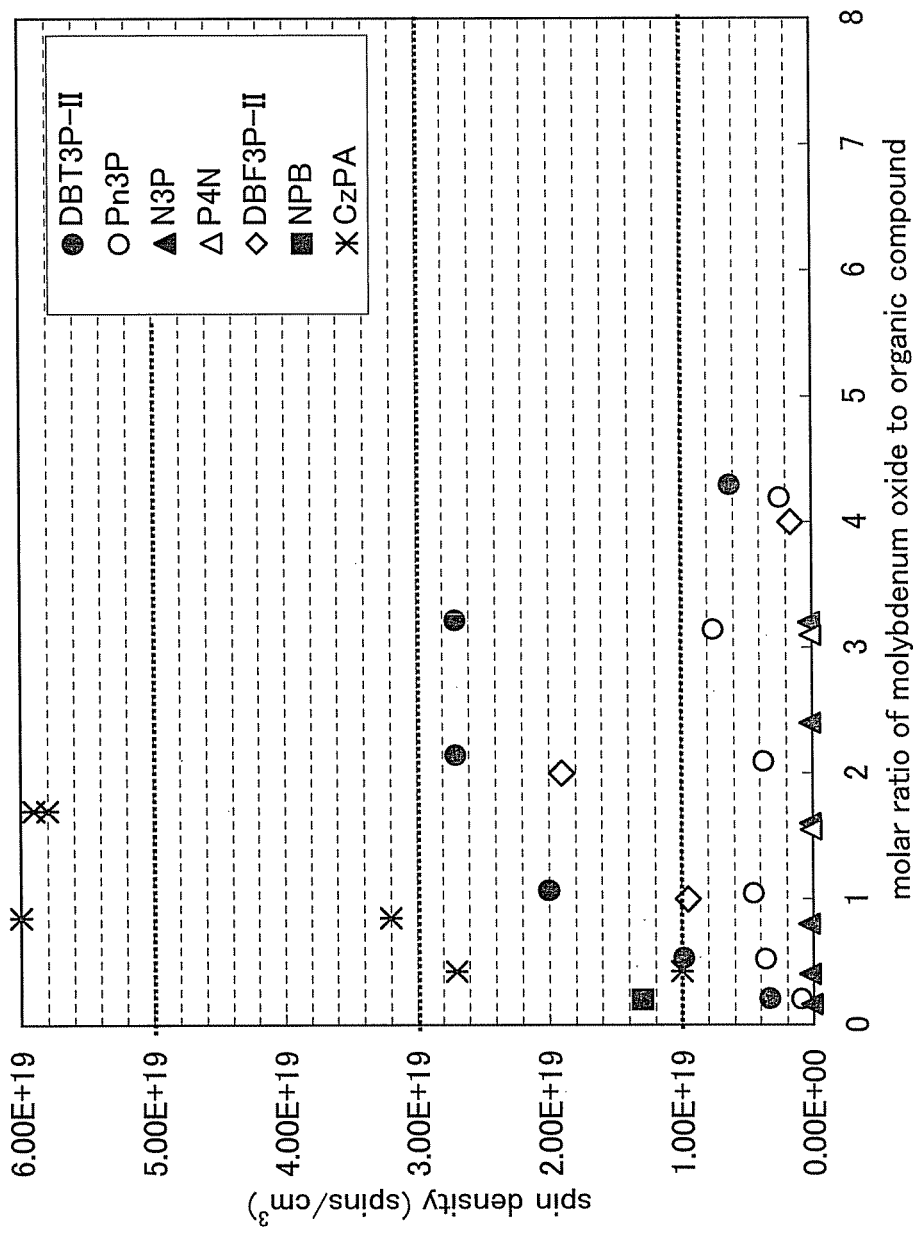
FIG. 3 is a graph showing relations between the molar ratios of molybdenum oxide to the organic compounds and spin densities calculated by measurements of electron spin resonance spectra.

In addition, FIG. 3 is an enlarged view of FIG. 2 and shows a graph of the spin densities in the range of $6\times10^{19}$ spins/cm$^3$ or less. As seen from FIG. 3, it is preferable in one embodiment of the present invention that the spin density in a layer containing a composite materials be less than or equal to $1\times10^{19}$ spins/cm$^3$, that the spin density be less than or equal to $3\times10^{19}$ spins/cm$^3$ when the molar ratio of molybdenum oxide to the organic compound is greater than or equal to 1, or that the spin density be less than or equal to $5\times10^{19}$ spins/cm$^3$ when the molar ratio is greater than or equal to 2.

Figure 13:
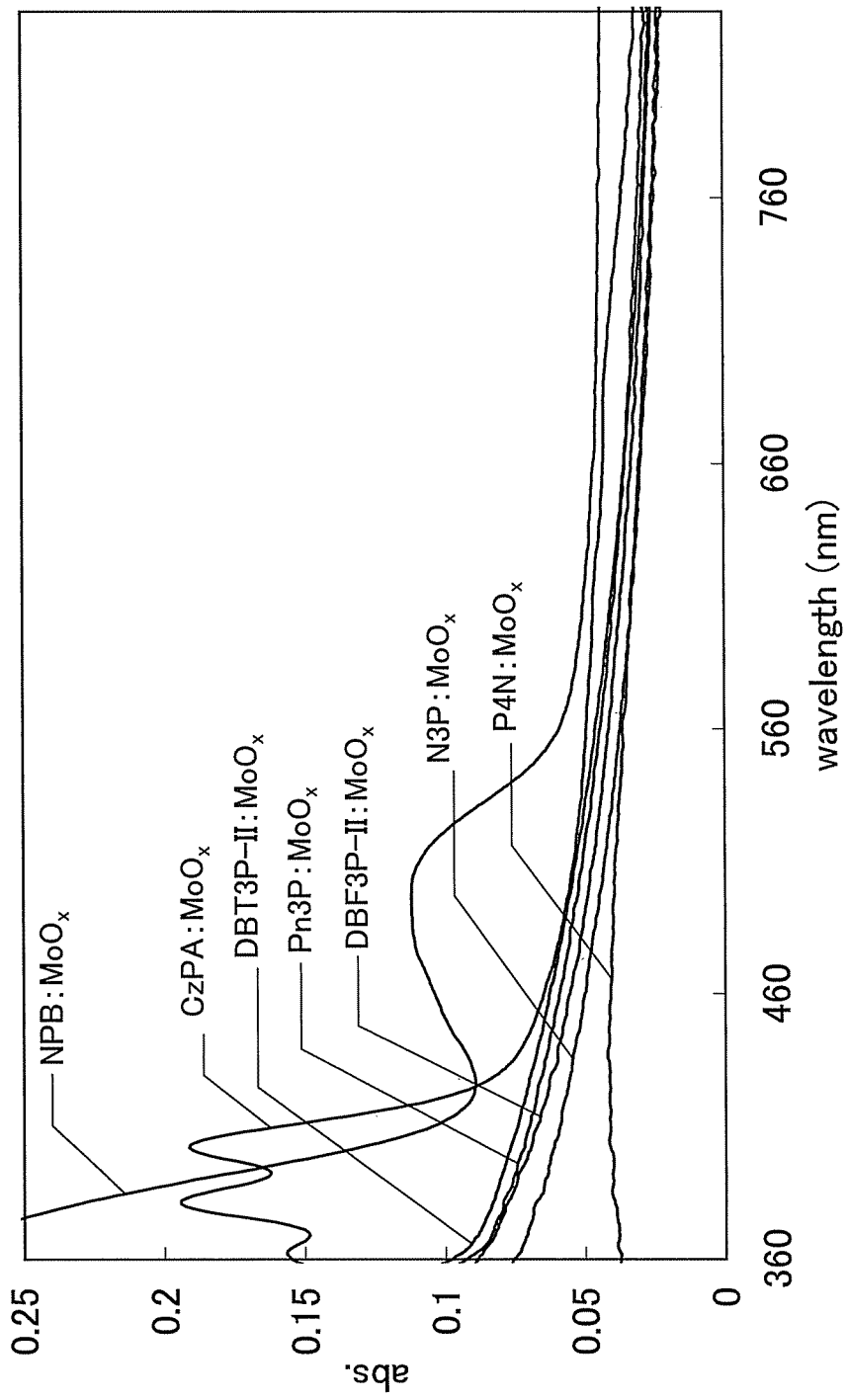
FIG. 13 shows absorption spectra of composite materials.

According to data of the absorption spectra in FIG. 12 and FIG. 13 and data in FIG. 2, carriers sufficient to be substantially observed in the absorption spectra, which indicate charge-transfer interaction in the composite materials, can be said to exist at a spin density exceeding the above-described spin density.

Embodiment 3

In this embodiment, a layer containing a composite material which includes an organic compound having a high hole-transport property and an electron acceptor and in which charge-transfer interaction does not occur easily is provided in contact with the cathode 102 in the EL layer 103.

Figure 4:
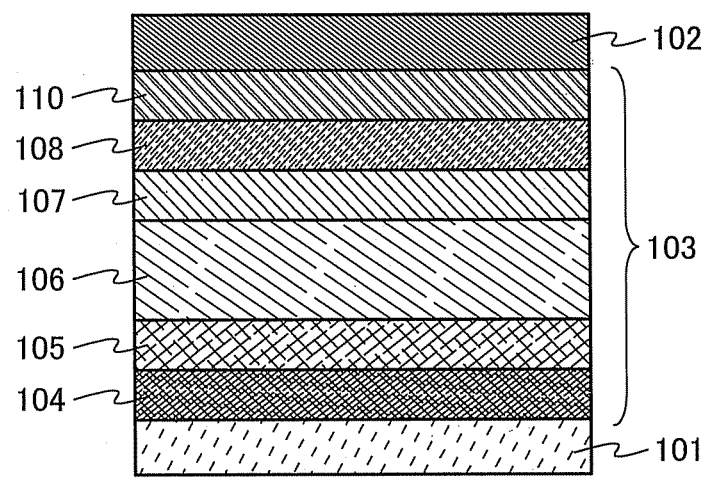
FIG. 4 illustrates a structure of a light-emitting element.

FIG. 4 illustrates a structure example of the light-emitting element in accordance with one embodiment of the present invention. The light-emitting element illustrated in FIG. 4 includes an anode 101 and a cathode 102, which correspond to the pair of electrodes, and an EL layer 103 provided between the anode 101 and the cathode 102.

In the example in FIG. 4, the EL layer 103 includes a charge generation layer 110 in addition to the hole-injection layer 104, the hole-transport layer 105, the light-emitting layer 106, the electron-transport layer 107, the electron-injection layer 108, and the like. Specifically, the hole-injection layer 104, the hole-transport layer 105, the light-emitting layer 106, the electron-transport layer 107, the electron-injection layer 108, the charge generation layer 110, and the cathode 102 are sequentially stacked over the anode 101.

In the light-emitting element illustrated in FIG. 4, the composite material which includes an organic compound having a high hole-transport property and an electron acceptor and in which charge-transfer interaction does not occur easily is used for the charge generation layer 110. In this composite material, charge-transfer interaction does not occur easily between the organic compound and the electron acceptor and the number of unpaired electrons generated by charge-transfer interaction is small accordingly. Specifically, in this composite material, the spin density measured by an ESR method is less than or equal to $1\times10^{19}$ spins/cm$^3$; alternatively, the spin density is less than or equal to $3\times10^{19}$ spins/cm$^3$ when the molar ratio of the electron acceptor to the organic compound is greater than or equal to 1, or the spin density is less than or equal to $5\times10^{19}$ spins/cm$^3$ when the molar ratio is greater than or equal to 2.

Specifically, a substance described in Embodiment 1 can be used as the above organic compound. Specifically, a substance described in Embodiment 1 can be used as the above electron acceptor.

When a voltage is applied between the anode 101 and the cathode 102 so that the potential of the anode 101 can be higher than that of the cathode 102, in the charge generation layer 110 containing the above composite material, electrons are extracted from the organic compound by the electron acceptor. Then, the extracted electrons are injected from the electron-injection layer 108 into the light-emitting layer 106 through the electron-transport layer 107.

In one embodiment of the present invention, since the charge generation layer 110 contains the composite material in which charge-transfer interaction does not occur easily between the organic compound having a high hole-transport property and the electron acceptor, the 300 nm to 600 nm wavelength light absorbed by the charge generation layer 110 due to charge-transfer interaction can be reduced. Accordingly, the transmittance of the charge generation layer 110 for visible light having a wavelength of 360 nm to 830 nm can be increased. Thus, in one embodiment of the present invention, the extraction efficiency of light from the light-emitting element can be increased, so that a light-emitting element capable of reducing power consumption and exhibiting high luminance and a light-emitting device using the light-emitting element can be provided.

Note that the anode 101, the cathode 102, the hole-injection layer 104, the hole-transport layer 105, the light-emitting layer 106, the electron-transport layer 107, and the electron-injection layer 108 can have the same structures as those in Embodiment 1.

This embodiment can be combined with any of the other embodiments as appropriate.

Embodiment 4

Figure 5:
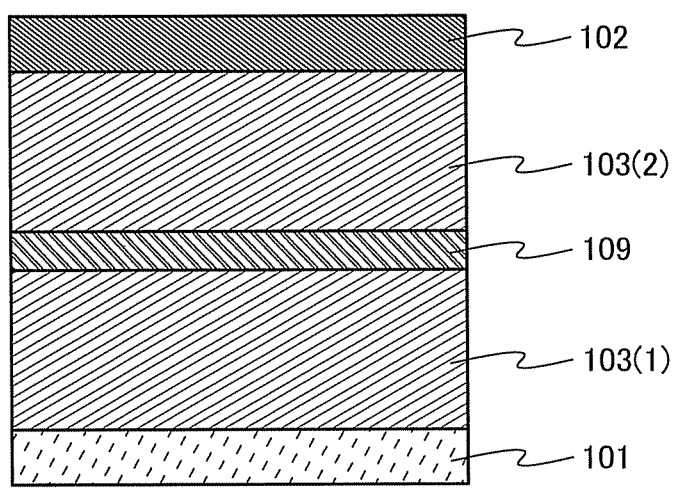
FIG. 5 illustrates a structure of a light-emitting element.

A light-emitting element in accordance with one embodiment of the present invention includes at least one charge generation layer, a plurality of stacked EL layers between which the charge generation layer is provided, and a pair of electrodes between which the charge generation layer and the plurality of EL layers are provided. FIG. 5 illustrates a structure example of the light-emitting element in accordance with one embodiment of the present invention.

The light-emitting element illustrated in FIG. 5 includes the anode 101 and the cathode 102, which correspond to the pair of electrodes, EL layers 103(1) and 103(2), which exemplify the plurality of EL layers, and a charge generation layer 109. Specifically, in the light-emitting element illustrated in FIG. 5, the EL layer 103(1) is placed in contact with the anode 101 and the charge generation layer 109 is placed in contact with the EL layer 103(1). In addition, the EL layer 103(2) is placed in contact with the charge generation layer 109 and the cathode 102 is placed in contact with the EL layer 103(2).

In one embodiment of the present invention, the composite material which includes the organic compound having a high hole-transport property and the electron acceptor and in which charge-transfer interaction does not occur easily is used for the charge generation layer 109.

Specifically, a substance described in Embodiment 1 can be used as the above organic compound. Specifically, a substance described in Embodiment 1 can be used as the above electron acceptor.

When a voltage is applied between the anode 101 and the cathode 102 so that the potential of the anode 101 can be higher than that of the cathode 102, in the charge generation layer 109 containing the above composite material, electrons are extracted from the organic compound by the electron acceptor. Then, the extracted electrons are injected into the EL layer 103(1), which is placed closer than the charge generation layer 109 to the anode 101, while holes generated through the extraction of electrons are injected into the EL layer 103(2), which is placed closer than the charge generation layer 109 to the cathode 102.

In the light-emitting element having the above structure, charge-transfer interaction does not occur easily between the organic compound and the electron acceptor in the charge generation layer 109. Consequently, the 300 nm to 600 nm wavelength light absorbed by the charge generation layer 109 due to charge-transfer interaction can be reduced, so that the transmittance of the charge generation layer for visible light having a wavelength of 360 nm to 830 nm can be increased.

When the light-emitting element has a structure in which the charge generation layer is provided between the plurality of stacked EL layers, the luminance of the light-emitting element can be increased while the amount of current supplied to the EL layers is reduced.

Note that the anode 101 and the cathode 102 can have the same structures as those in Embodiment 1. Further, the plurality of EL layers, which is exemplified as the EL layer 103(1) and the EL layer 103(2), may all have the same structure or at least one of the EL layers may have a different structure from that of another as long as each includes at least a light-emitting layer. At least one of the plurality of EL layers, which is exemplified as the EL layer 103(1) and the EL layer 103(2), may have the same structure as the EL layer 103 described in Embodiment 1 or Embodiment 3.

To increase the property of injecting electrons into the EL layer 103(1), which is placed closer than the charge generation layer 109 to the anode 101, it is preferable that a layer containing a substance having a high electron-transport property or a layer containing a substance having a high electron-injection property be provided in contact with the charge generation layer 109 in the EL layer 103(1).

Further, the charge generation layer 109 may be constituted of a single layer or a plurality of stacked layers.

Figure 6:
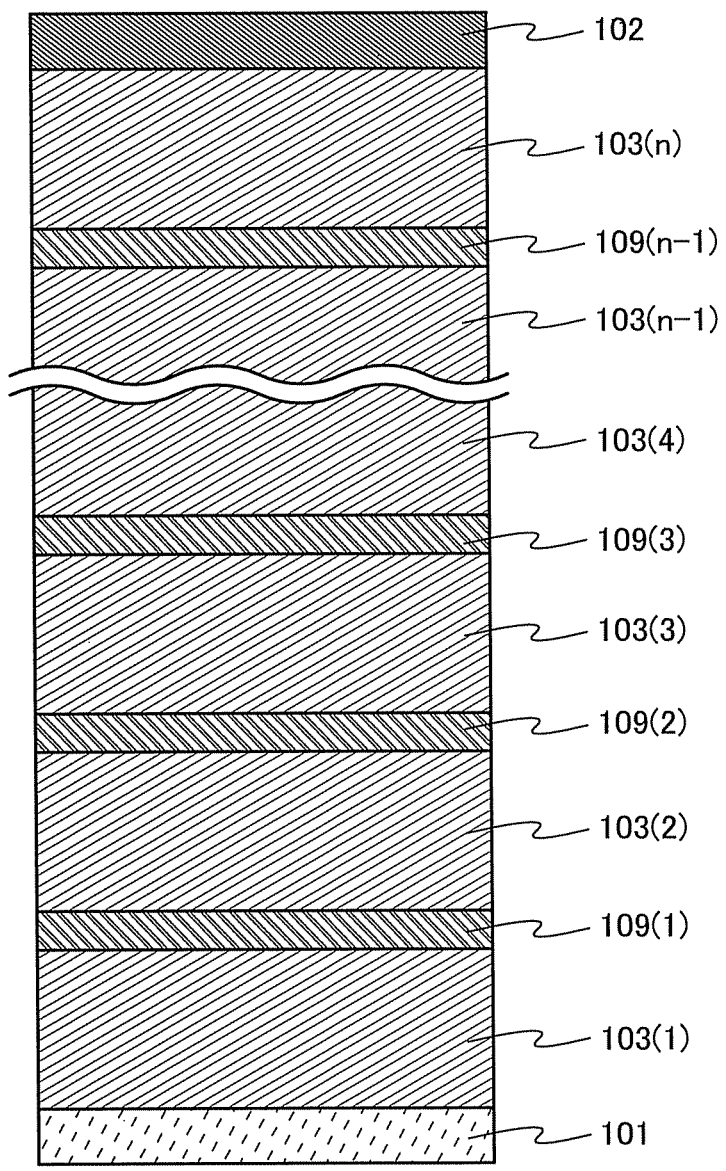
FIG. 6 illustrates a structure of a light-emitting element.

Note that the number of EL layers is two in the example in FIG. 5 but may be three or more. FIG. 6 illustrates a structure example of a light-emitting element in accordance with one embodiment of the present invention in which n EL layers are used.

The light-emitting element illustrated in FIG. 6 includes the anode 101 and the cathode 102 which correspond to the pair of electrodes, EL layers 103(1) to 103(n) which exemplify the plurality of EL layers, and charge generation layers 109(1) to 109(n−1), where n is assumed to be a natural number greater than or equal to 3. Specifically, in the light-emitting element illustrated in FIG. 6, an EL layer 103(t−1), a charge generation layer 109(t−1), and an EL layer 103(t) are sequentially stacked over the anode 101 between the anode 101 and the cathode 102, where t is assumed to be a natural number greater than or equal to 2 and less than or equal to n.

In one embodiment of the present invention, the composite material which includes the organic compound having a high hole-transport property and the electron acceptor and in which charge-transfer interaction does not occur easily is used for each of the charge generation layers 109(1) to 109(n−1). Accordingly, the 300 nm to 600 nm wavelength light absorbed by the charge generation layers due to charge-transfer interaction can be reduced. Thus, also in the case where two or more charge generation layers are stacked, a reduction in light extraction efficiency can be reduced.

This embodiment can be combined with any of the other embodiments as appropriate.

Embodiment 5

In this embodiment, a passive matrix light-emitting device which is an example of a light-emitting device in accordance with one embodiment of the present invention is described.

Figure 7:
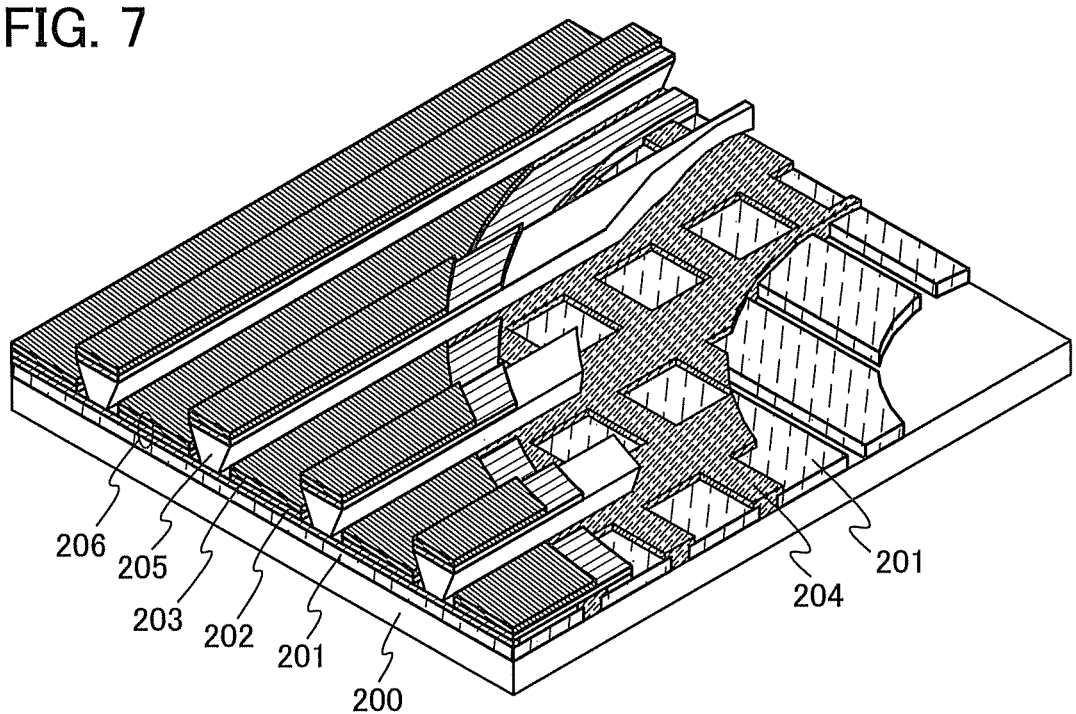
FIG. 7 is a perspective view illustrating a light-emitting device.

FIG. 7 is a perspective view of a structure example of the passive matrix light-emitting device. Note that in FIG. 7, each of the layers except a substrate 200 is partly omitted for clear illustration of the stack structure of the light-emitting device.

In the light-emitting device illustrated in FIG. 7, a plurality of first electrodes 201 is arranged in parallel over the substrate 200 having an insulating surface. Further, a first partition layer 204 is placed over the substrate 200 and the plurality of first electrodes 201. The first partition layer 204 has a plurality of openings, and parts of the plurality of first electrodes 201 are exposed in the openings. A plurality of second partition layers 205 is arranged in parallel over the first partition layer 204. In addition, the longitudinal direction of the plurality of first electrodes 201 intersects with the longitudinal direction of the plurality of second partition layers 205.

An EL layer 202 and a second electrode 203 are sequentially stacked over the plurality of first electrodes 201, the first partition layer 204, and the plurality of second partition layers 205. The first electrodes 201, the EL layer 202, and the second electrode 203 are sequentially stacked in the openings of the first partition layer 204, thereby forming a light-emitting element 206. One of the first electrode 201 and the second electrode 203 corresponds to an anode and the other corresponds to a cathode.

A cross section of each second partition layer 205 along the longitudinal direction of the first electrodes 201 has a shape in which the taper angle formed between a surface of the first partition layer 204 and a side of the second partition layer 205 is less than 90°, i.e., a so-called inverted tapered shape. By having this shape, the plurality of second partition layers 205 splits the EL layer 202 and the second electrode 203, so that the EL layer 202 and the second electrode 203 are partly located over the second partition layer 205 and partly located between the second partition layers 205.

In the light-emitting device in accordance with one embodiment of the present invention, the composite material which includes an organic compound having a high hole-transport property and an electron acceptor and in which charge-transfer interaction does not occur easily is used for a layer included in the EL layer 202. Note that although the case where the light-emitting element 206 includes one EL layer 202 is exemplified in FIG. 7, the light-emitting element 206 may include, between the first electrode 201 and the second electrode 203, at least one charge generation layer and a plurality of stacked EL layers between which the charge generation layer is provided, as described in Embodiment 4. In this case, the charge generation layer may contain the composite material which includes the organic compound having a high hole-transport property and the electron acceptor and in which charge-transfer interaction does not occur easily. Alternatively, a layer included in any one of the plurality of EL layers may contain the composite material which includes the organic compound having a high hole-transport property and the electron acceptor and in which charge-transfer interaction does not occur easily.

Note that in a light-emitting device in accordance with one embodiment of the present invention, a color filter method in which a color filter and a light-emitting element that emits light of a single color such as white are used in combination in order to display a full-color image can be employed. A method in which a full-color image is displayed with the use of a plurality of light-emitting elements emitting light of different hues can also be employed. This method is referred to as separate coloring method because EL layers, which are each placed between a pair of electrodes in a light-emitting element, are separately colored with their corresponding colors.

This embodiment can be combined with any of the other embodiments as appropriate.

Embodiment 6

In this embodiment, an active matrix light-emitting device which is an example of a light-emitting device in accordance with one embodiment of the present invention is described.

Pixels having a variety of circuit configurations for active matrix light-emitting devices have been proposed. In general, a light-emitting element, a transistor (switching transistor) which controls input of a video signal to a pixel, and a transistor (driving transistor) which controls the amount of current supplied to the light-emitting element are provided in each pixel.

Figure 8:
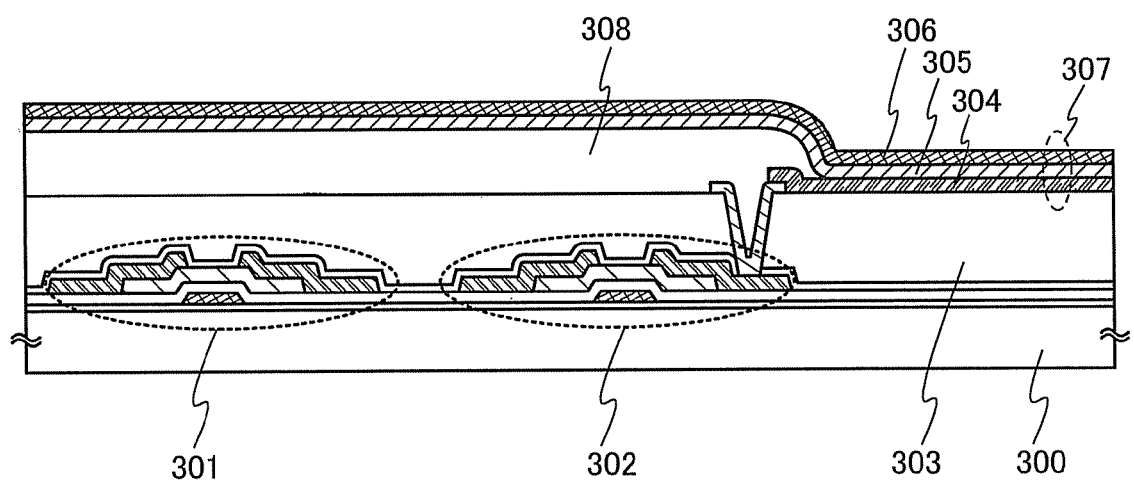
FIG. 8 is a cross-sectional view illustrating a light-emitting device.

FIG. 8 is a cross-sectional view of a pixel included in the active matrix light-emitting device. In FIG. 8, a switching transistor 301 and a driver transistor 302 are provided over a substrate 300 having an insulating surface. The switching transistor 301 and the driver transistor 302 are covered with an insulating film 303, and a first electrode 304 is formed over the insulating film 303. Note that the first electrode 304 is electrically connected to the driver transistor 302 through an opening provided through the insulating film 303.

A partition layer 308 having an opening is formed over the insulating film 303 and the first electrode 304, and part of the first electrode 304 is exposed in this opening. An EL layer 305 and a second electrode 306 are sequentially stacked over the first electrode 304 and the partition layer 308. The first electrode 304, the EL layer 305, and the second electrode 306 are sequentially stacked in the opening of the first partition layer 308, thereby forming a light-emitting element 307. One of the first electrode 304 and the second electrode 306 corresponds to an anode and the other corresponds to a cathode.

In the light-emitting device in accordance with one embodiment of the present invention, the composite material which includes an organic compound having a high hole-transport property and an electron acceptor and in which charge-transfer interaction does not occur easily is used for a layer included in the EL layer 305. Note that although the case where the light-emitting element 307 includes one EL layer 305 is exemplified in FIG. 8, the light-emitting element 307 may include, between the first electrode 304 and the second electrode 306, at least one charge generation layer and a plurality of EL layers which are stacked in such a way that the charge generation layer is positioned between the EL layers, as described in Embodiment 4. In this case, the charge generation layer preferably contains the composite material which includes an organic compound having a high hole-transport property and an electron acceptor and in which charge-transfer interaction does not occur easily, in which case visible light transmittance can be improved. Alternatively, a layer included in any one of the plurality of EL layers may contain the composite material which includes an organic compound having a high hole-transport property and an electron acceptor and in which charge-transfer interaction does not occur easily.

Note that either a color filter method or a separate coloring method may be used for the above light-emitting device.

This embodiment can be combined with any of the other embodiments as appropriate.

Embodiment 7

Figure 9:
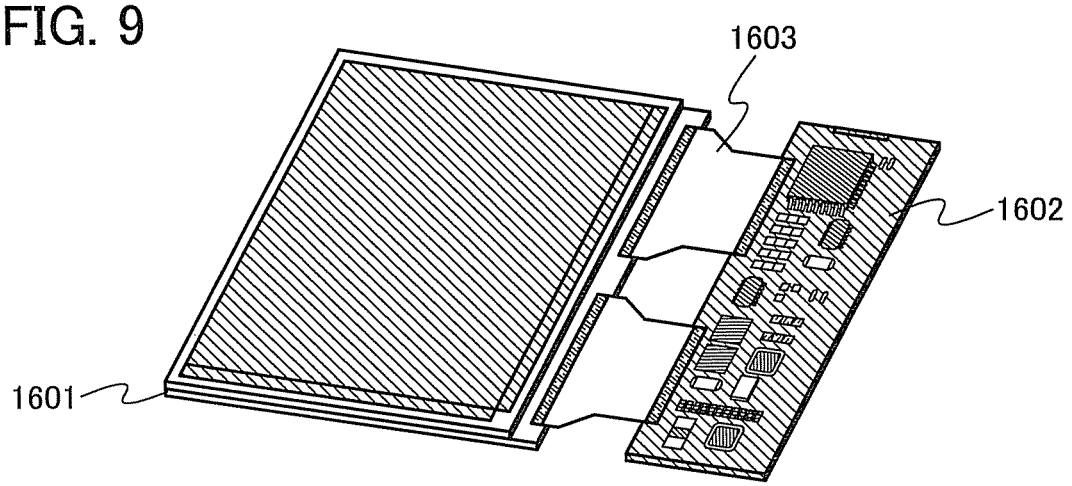
FIG. 9 is a perspective view illustrating a light-emitting device.

FIG. 9 illustrates an example of a perspective view of the light-emitting device in accordance with one embodiment of the present invention. The light-emitting device illustrated in FIG. 9 includes a display portion 1601, a circuit board 1602, and connection portions 1603.

The circuit board 1602 is provided with an image processing portion, from which various signals and power supply potentials are input to the display portion 1601 through the connection portions 1603. For the connection portions 1603, a flexible printed circuit (FPC) or the like can be used. Alternatively, a COF tape can be used for the connection portions 1603, in which case part of circuits of the image processing portion or part of the driver circuits included in the display portion 1601 may be formed over a separately prepared chip, and the chip may be connected to the COF tape by a chip on film (COF) method.

This embodiment can be implemented in combination with any of the above embodiments.

Embodiment 8

Figure 10A:
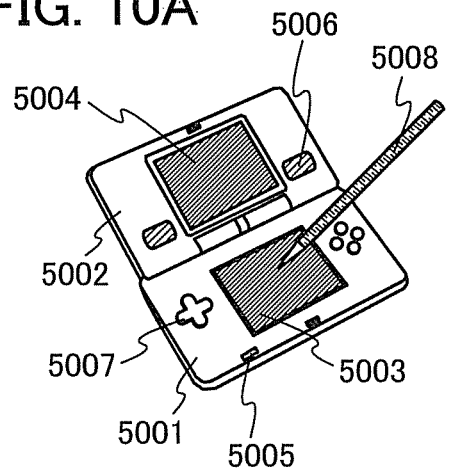
FIGS. 10A to 10C illustrate electronic devices.
Figure 10B:
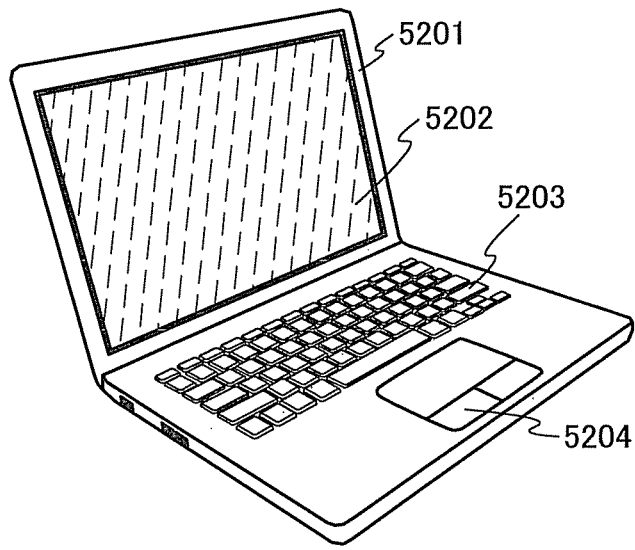
Figure 10C:
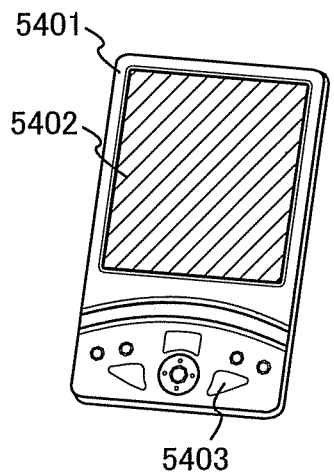

A light-emitting device in accordance with one embodiment of the present invention can exhibit high luminance even when the amount of current supplied to a light-emitting element is reduced. Accordingly, the power consumption of an electronic device using the light-emitting device can be reduced. In addition, the lifetime of the light-emitting element can be favorably increased, and the reliability of an electronic device using the light-emitting device can be increased accordingly. FIGS. 10A to 10C illustrate specific examples of the electronic device using the light-emitting device in accordance with one embodiment of the present invention.

FIG. 10A illustrates a portable game machine, which includes a housing 5001, a housing 5002, an image display portion 5003, an image display portion 5004, a microphone 5005, speakers 5006, an operation key 5007, a stylus 5008, and the like. The light-emitting device in accordance with one embodiment of the present invention can be used as the image display portion 5003 or the image display portion 5004. With the use of the light-emitting device in accordance with one embodiment of the present invention for the image display portion 5003 or the image display portion 5004, a portable game machine having low power consumption or high reliability can be provided. Note that although the portable game machine illustrated in FIG. 10A has the two image display portions 5003 and 5004, the number of image display portions included in a portable game machine is not limited to this.

FIG. 10B illustrates a laptop personal computer including a housing 5201, an image display portion 5202, a keyboard 5203, a pointing device 5204, and the like. The light-emitting device in accordance with one embodiment of the present invention can be used for the image display portion 5202. With the use of the light-emitting device in accordance with one embodiment of the present invention for the image display portion 5202, a laptop personal computer having low power consumption or high reliability can be provided.

FIG. 10C illustrates a personal digital assistant including a housing 5401, an image display portion 5402, operation keys 5403, and the like. The light-emitting device in accordance with one embodiment of the present invention can be used as the image display portion 5402. With the use of the light-emitting device in accordance with one embodiment of the present invention for the image display portion 5402, a personal digital assistant having low power consumption or high reliability can be provided.

Figure 11A:
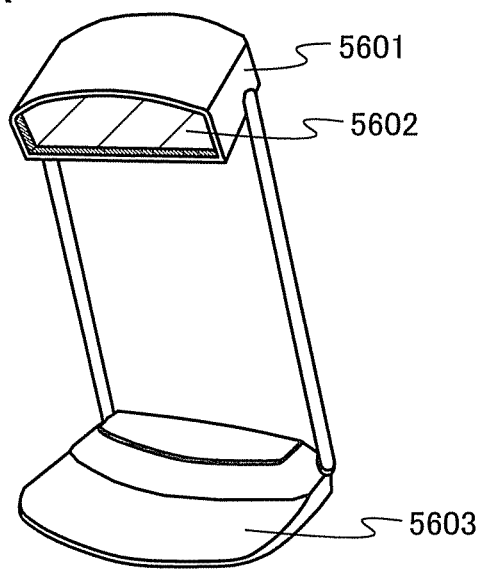
FIGS. 11A and 11B illustrate lighting devices.

FIG. 11A illustrates a table lighting device including a housing 5601, a light source 5602, a support base 5603, and the like. The display device in accordance with one embodiment of the present invention can be used for the light source 5602. With the use of the light-emitting device in accordance with one embodiment of the present invention for the light source 5602, a table lighting device having low power consumption or high reliability can be provided.

Figure 11B:
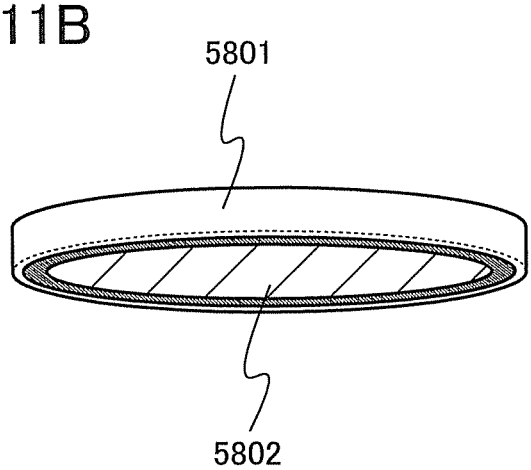

FIG. 11B illustrates an installation lighting device including a housing 5801, a light source 5802, and the like. The light-emitting device in accordance with one embodiment of the present invention can be used for the light source 5802. With the use of the light-emitting device in accordance with one embodiment of the present invention for the light source 5802, an installation lighting device having low power consumption or high reliability can be provided.

As described above, the application range of the present invention is extremely wide and the present invention can be applied to electronic devices hi a variety of fields.

This embodiment can be combined with any of the other embodiments as appropriate.

Example 1

In this example, a light-emitting element 1 in which 9-[3,5-di(phenanthren-9-yl)phenyl]phenanthrene (abbreviation: Pn3P) and molybdenum(VI) oxide are used for a hole-injection layer is described with reference to FIG. 1. Structural formulae of materials used in this example are illustrated below; however, structural formulae of the materials given in the above embodiment are omitted here.

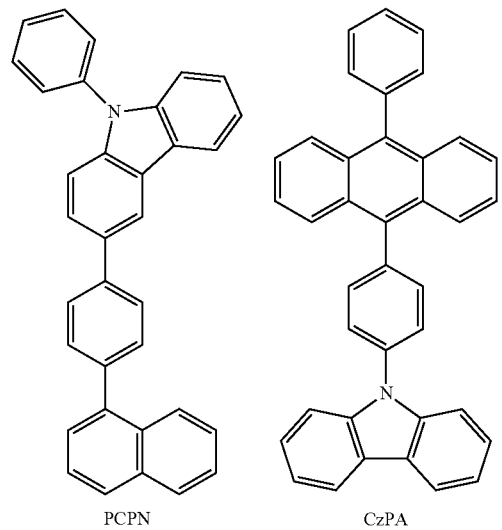

PCPN          CzPA

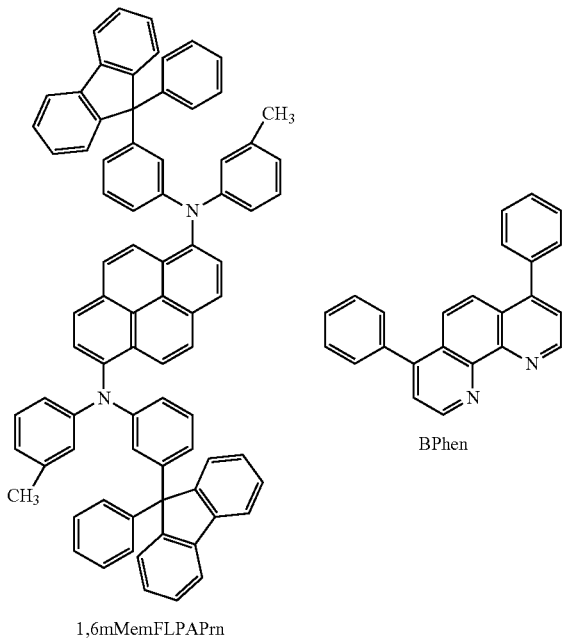

1,6mMemFLPAPrn

BPhen

Furthermore, 9-[4-(N-carbazolyl)]phenyl-10-phenylanthracene (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were co-evaporated to form a light-emitting layer 106 over the hole-transport layer 105. Here, the mass ratio of CzPA to 1,6mMemFLPAPrn was adjusted to 1:0.04 (=CzPA:1,6mMemFLPAPrn). In addition, the thickness of the light-emitting layer 106 was set to 30 nm.

Further, over the light-emitting layer 106, a film of CzPA was formed to a thickness of 10 nm and then a film of bathophenanthroline (abbreviation: BPhen) was formed to a thickness of 15 nm, so that an electron-transport layer 107 was formed.

Further, over the electron-transport layer 107, a film of lithium fluoride (LiF) was formed to a thickness of 1 nm by evaporation, thereby forming an electron-injection layer 108.

Lastly, over the electron-injection layer 108, an aluminum film was formed to a thickness of 200 nm by evaporation, thereby forming a cathode 102. Thus, the light-emitting element 1 of this example was fabricated:

Note that, in all the above evaporation steps, evaporation was performed by a resistance-heating method.

Table 4 shows element structures of the light-emitting element 1 obtained as described above.

TABLE 4

| | Anode | Hole-injection layer | Hole transport layer | Light-emitting layer | Electron transport layer | | Electron injection layer | Cathode |
|---|---|---|---|---|---|---|---|---|
| Light-emitting element 1 | ITSO 110 nm | Pn3P:MoOx (=4:2) 50 nm | PCPN 10 nm | CzPA:1,6mMemFLPAPrn (=1:0.04) 30 nm | CzPA 10 nm | BPhen 15 nm | LiF 1 nm | Al 200 nm |

(Fabrication of Light-Emitting Element 1)

First, a film of indium tin oxide containing silicon oxide (ITSO) was formed over a glass substrate by a sputtering method, so that an anode 101 was formed. The thickness thereof was 110 nm and the electrode area was 2 mm×2 mm.

In pretreatment for forming the light-emitting element over the glass substrate, UV ozone treatment was performed for 370 seconds after washing of a surface of the glass substrate with water and baking that was performed at 200° C. for 1 hour.

After that, the glass substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate was cooled down for about 30 minutes.

Next, the glass substrate, provided with the anode 101 was fixed to a substrate holder in the vacuum evaporation apparatus so that the surface over which the anode 101 was provided faced downward. The pressure in the vacuum evaporation apparatus was reduced to about $10^{-4}$ Pa. Then, over the anode 101, Pn3P and molybdenum(VI) oxide were co-evaporated to form a hole-injection layer 104. The thickness of the hole-injection layer 104 was set to 50 nm, and the mass ratio of Pn3P to molybdenum oxide was adjusted to 4:2 (=Pn3P:molybdenum oxide).

Next, over the hole-injection layer 104, a film of 3-[4-(1-naphthyl)-phenyl]-9-phenyl-9H-carbazole (abbreviation: PCPN) was formed to a thickness of 10 nm, thereby forming a hole-transport layer 105.

In a glove box containing a nitrogen atmosphere, the fabricated light-emitting element 1 was sealed so as not to be exposed to the air.

(Operation Characteristics of Light-Emitting Element 1)

Operation characteristics of the fabricated light-emitting element 1 were measured. Note that the measurements were carried out at room temperature (in an atmosphere kept at 25° C.).

Figure 14:
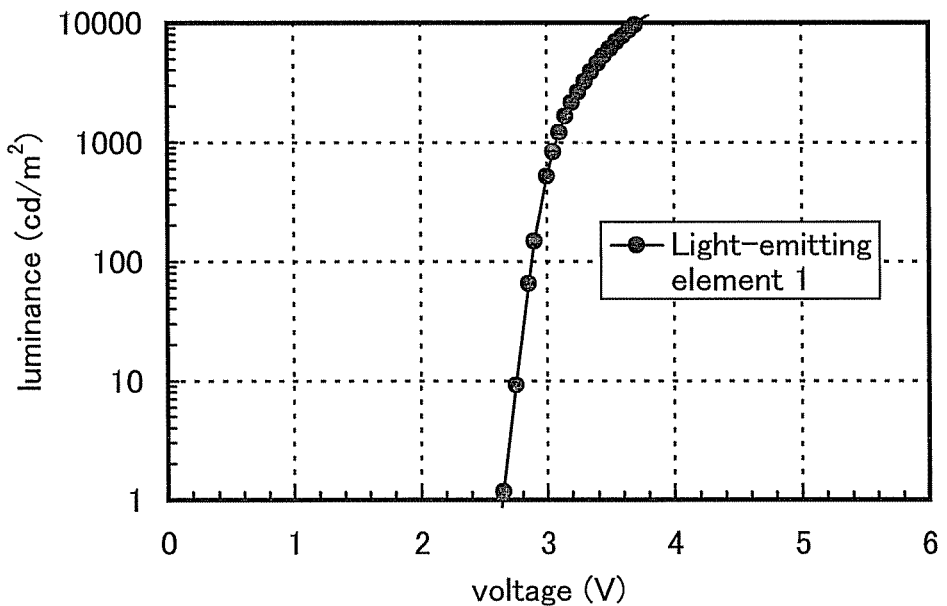
FIG. 14 shows luminance versus voltage characteristics of a light-emitting element 1.
Figure 15:
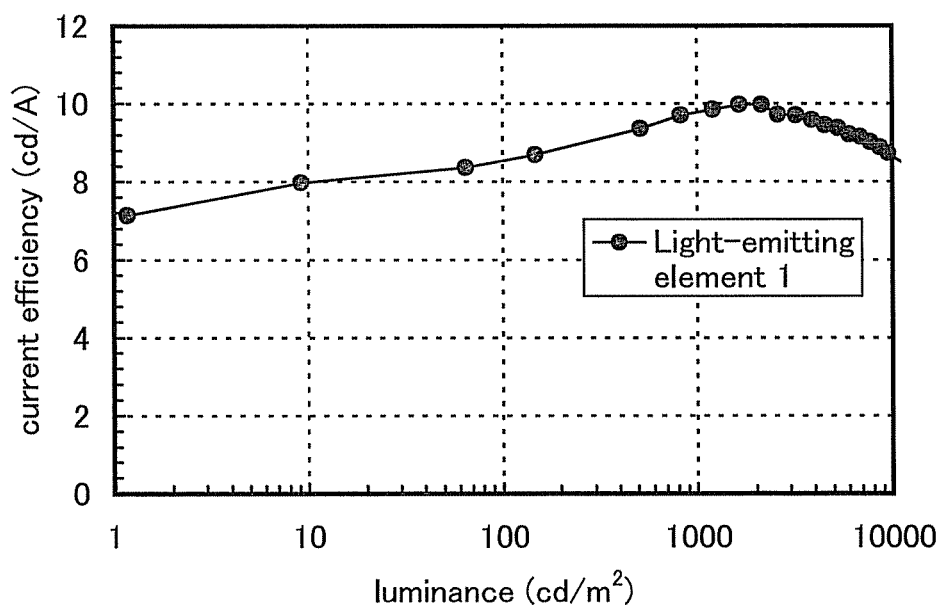
FIG. 15 shows current efficiency versus luminance characteristics of the light-emitting element 1.

The luminance versus voltage characteristics of the light-emitting element 1 are shown in FIG. 14, and the current efficiency versus luminance characteristics of the element are shown in FIG. 15. In FIG. 14, the horizontal axis represents voltage (V) and the vertical axis represents luminance (cd/m$^2$). In FIG. 15, the horizontal axis represents luminance (cd/m$^2$) and the vertical axis represents current efficiency (cd/A).

The initial values of the main characteristics of the light-emitting element 1 at a luminance of around 830 cd/m$^2$ are shown in Table 5 below.

TABLE 5

| | Voltage (V) | Chromaticity coordinates (x, y) | Current efficiency (cd/A) | External quantum efficiency (%) |
|---|---|---|---|---|
| Light-emitting element 1 | 3.1 | (0.14, 0.17) | 9.7 | 7.8 |

As shown in Table 5, the CIE chromaticity coordinates of the light-emitting element 1 are (x, y)=(0.14, 0.17) at a luminance of 830 cd/m². These results show that blue light emission originating from 1,6mMemFLPAPrn was obtained from the light-emitting element 1.

As can be seen from FIG. 14 and FIG. 15, the light-emitting element 1, has a low driving voltage and high emission efficiency.

The above results suggest that a light-emitting element having high emission efficiency or a light-emitting element having a low driving voltage can be achieved because a composite material in which charge-transfer interaction does not occur easily is used for the hole-injection layer of the light-emitting element.

Example 2

In this example, a light-emitting element 2 in which 1,3,5-tri(dibenzothiophen-4-yl)benzene (abbreviation: DBT3P-II) and molybdenum(VI) oxide were used for a hole-injection layer is described with reference to FIG. 1. Structural formulae of materials used in this example are illustrated below; however, structural formulae of the materials given in the above embodiment or example are omitted here.

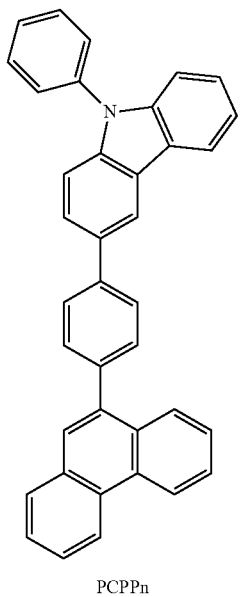

PCPPn

-continued

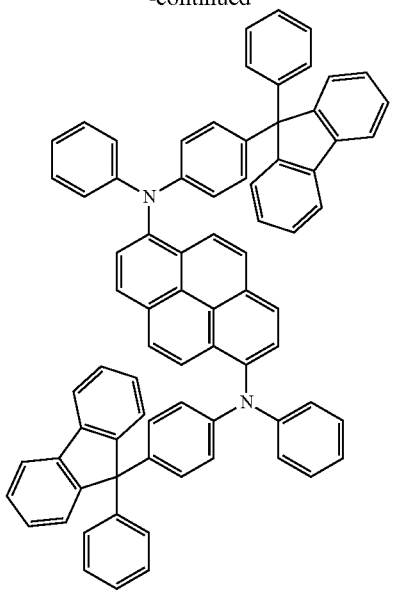

1,6-FLPAPrn (Fabrication of Light-Emitting Element 2)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

In pretreatment for forming the light-emitting element over the glass substrate, UV ozone treatment was performed for 370 seconds after washing of a surface of the glass substrate with water and baking that was performed at 200° C. for 1 hour.

After that, the glass substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate was cooled down for about 30 minutes.

Next, the glass substrate provided with the anode 101 was fixed to a substrate holder in the vacuum evaporation apparatus so that the surface over which the anode 101 was provided faced downward. The pressure in the vacuum evaporation apparatus was reduced to about $10^{-4}$ Pa. Then, over the anode 101, DBT3P-II and molybdenum(VI) oxide were co-evaporated to form a hole-injection layer 104. The thickness of the hole-injection layer 104 was set to 50 nm, and the mass ratio of DBT3P-II to molybdenum oxide was adjusted to 4:2 (=DBT3P-II:molybdenum oxide).

Next, over the hole-injection layer 104, a film of 3-[4-(9-phenanthryl)-phenyl]-9-phenyl-9H-carbazole (abbreviation: PCPPn) was formed to a thickness of 10 nm, thereby forming a hole-transport layer 105.

Furthermore, 9-[4-(N-carbazolyl)]phenyl-10-phenylanthracene (abbreviation: CzPA) and N,N'-bis[4-(9-phenyl-9H-fluoren-9-yl)phenyl]-N,N'-diphenylpyrene-1,6-diamine (abbreviation: 1,6-FLPAPrn) were co-evaporated to form a light-emitting layer 106 over the hole-transport layer 105. Here, the mass ratio of CzPA to 1,6-FLPAPrn was adjusted to 1:0.05 (=CzPA:1,6-FLPAPrn). In addition, the thickness of the light-emitting layer 106 was set to 30 nm.

Further, over the light-emitting layer 106, a film of CzPA was formed to a thickness of 10 nm and then a film of bathophenanthroline (abbreviation: BPhen) was formed to a thickness of 15 nm, so that the electron-transport layer 107 was formed.

Further, over the electron-transport layer 107, a film of lithium fluoride (LiF) was formed to a thickness of 1 nm by evaporation, thereby forming the electron-injection layer 108.

Lastly, over the electron-injection layer 108, an aluminum film was formed to a thickness of 200 nm by evaporation to form the cathode 102. Thus, the light-emitting element 2 of this example was fabricated.

Note that, in all the above evaporation steps, evaporation was performed by a resistance-heating method.

Table 6 shows element structures of the light-emitting element 2 obtained as described above.

TABLE 6

| | Anode | Hole-injection layer | Hole transport layer | Light-emitting layer | Electron transport layer | Electron injection layer | Cathode |
|---|---|---|---|---|---|---|---|
| Light-emitting element 2 | ITSO 110 nm | DBT3P-II:MoOx (=4:2) 50 nm | PCPPn 10 nm | CzPA:1,6-FLPAPrn (=1:0.05) 30 nm | CzPA 10 nm | BPhen 15 nm | LiF 1 nm | Al 200 nm |

In a glove box containing a nitrogen atmosphere, the fabricated light-emitting element 2 was sealed so as not to be exposed to the air.

(Operation Characteristics of Light-Emitting Element 2)

Operation characteristics of the fabricated light-emitting element 2 were measured. Note that the measurements were carried out at room temperature (in an atmosphere kept at 25° C.).

Figure 16:
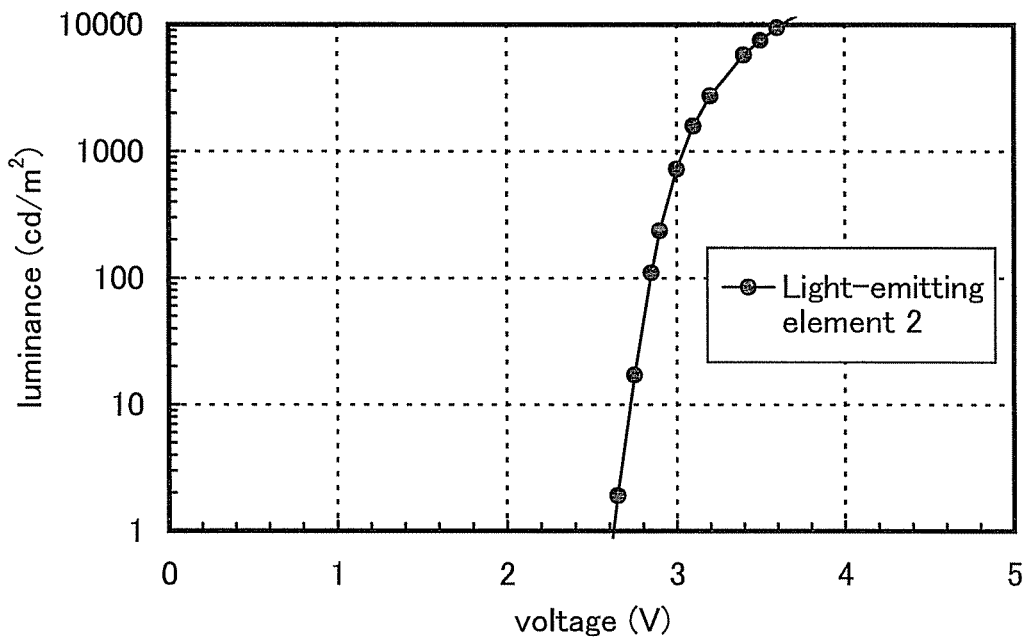
FIG. 16 shows luminance versus voltage characteristics of a light-emitting element 2.
Figure 17:
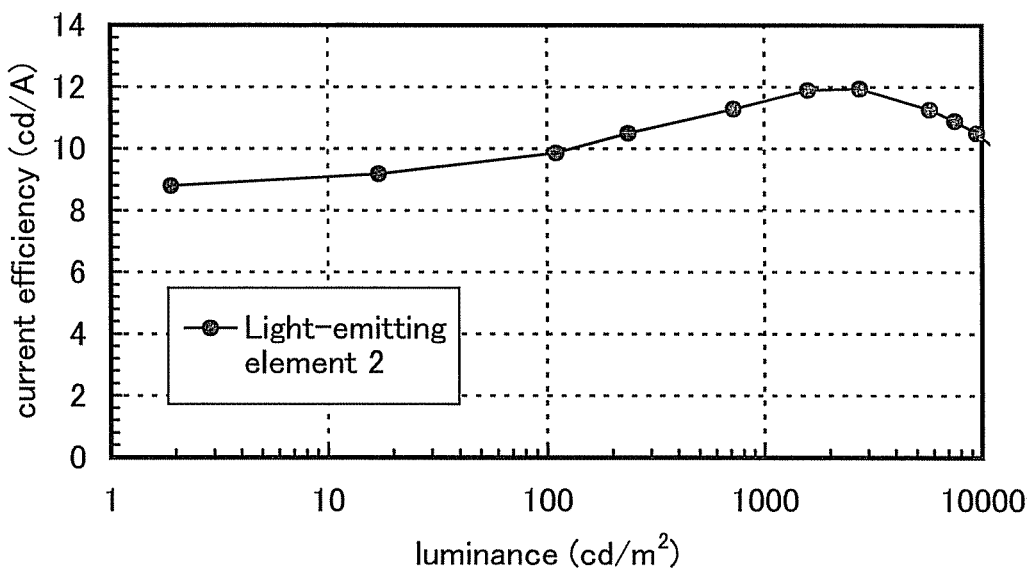
FIG. 17 shows current efficiency versus luminance characteristics of the light-emitting element 2.

The luminance versus voltage characteristics of the light-emitting element 2 are shown in FIG. 16, and the current efficiency versus luminance characteristics of the element are shown in FIG. 17. In FIG. 16, the horizontal axis represents voltage (V) and the vertical axis represents luminance ($cd/m^2$). In FIG. 17, the horizontal axis represents luminance ($cd/m^2$) and the vertical axis represents current efficiency (cd/A).

The initial values of the main characteristics of the light-emitting element 2 at a luminance of around 720 $cd/m^2$ are shown in Table 7 below.

TABLE 7

| | Voltage (V) | Chromaticity coordinates (x, y) | Current efficiency (cd/A) | External quantum efficiency (%) |
|---|---|---|---|---|
| Light-emitting element 2 | 3.0 | (0.15, 0.22) | 11 | 7.4 |

As shown in Table 7, the CIE chromaticity coordinates of the light-emitting element 2 are (x, y)=(0.15, 0.22) at a luminance of 720 $cd/m^2$. These results show that blue light emission originating from 1,6-FLPAPrn was obtained from the light-emitting element 2.

As can be seen from FIG. 16 and FIG. 17, the light-emitting element 2 has a low driving voltage and high emission efficiency.

The above results suggest that a light-emitting element having high emission efficiency or a light-emitting element having a low driving voltage can be achieved because a composite material in which charge-transfer interaction does not occur easily is used for the hole-injection layer of the light-emitting element.

Example 3

In this example, a light-emitting element 3 in which 9-[3,5-di(phenanthren-9-yl)phenyl]phenanthrene (abbreviation: Pn3P) and molybdenum(VI) oxide were used for a charge generation layer is described with reference to FIG. 5. Structural formulae of materials used in this example are illustrated below; however, structural formulae of the materials given in the above embodiment or example are omitted here.

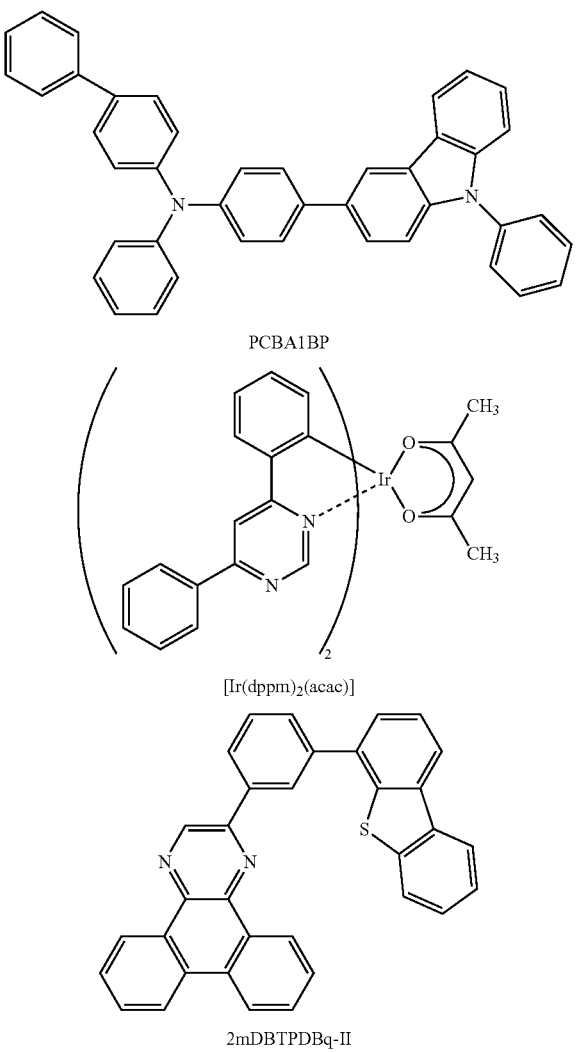

PCBA1BP

[Ir(dppm)$_2$(acac)]

2mDBTPDBq-II

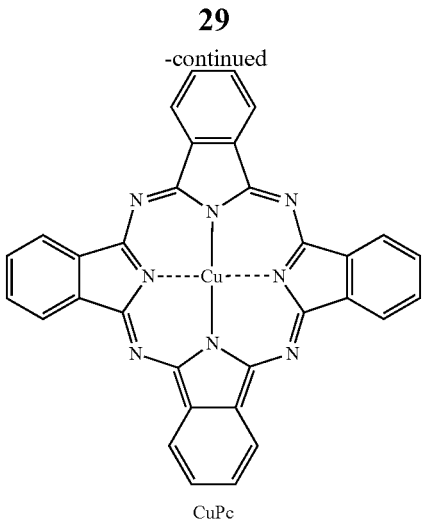

CuPc (Fabrication of Light-Emitting Element 3)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

In pretreatment for forming the light-emitting element over the glass substrate, UV ozone treatment was performed for 370 seconds after washing of a surface of the glass substrate with water and baking that was performed at 200° C. for 1 hour.

After that, the glass substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate was cooled down for about 30 minutes.

Next, the glass substrate provided with the anode 101 was fixed to a substrate holder in the vacuum evaporation apparatus so that the surface over which the anode 101 was provided faced downward. The pressure in the vacuum evaporation apparatus was reduced to about $10^{-4}$ Pa. Then, over the anode 101, Pn3P and molybdenum(VI) oxide were co-evaporated to form a hole-injection layer (first hole-injection layer) included in the EL layer 103(1). The thickness of the first hole-injection layer was set to 33 nm, and the mass ratio of Pn3P to molybdenum oxide was adjusted to 1:0.5 (=Pn3P:molybdenum oxide).

Next, over the first hole-injection layer, a film of 3-[4-(1-naphthyl)-phenyl]-9-phenyl-9H-carbazole (abbreviation: PCPN) was formed to a thickness of 30 nm, thereby forming a hole-transport layer (first hole-transport layer) included in the EL layer 103(1).

Furthermore, 9-[4-(N-carbazolyl)]phenyl-10-phenylanthracene (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) were co-evaporated to form a light-emitting layer (first light-emitting layer) included in the EL layer 103(1) over the first hole-transport layer. Here, the mass ratio of CzPA to 1,6mMemFLPAPrn was adjusted to 1:0.05 (=CzPA:1,6mMemFLPAPrn). In addition, the thickness of the first light-emitting layer was set to 30 nm.

Next, over the first light-emitting layer, a film of CzPA was formed to a thickness of 5 nm and then a film of bathophenanthroline (abbreviation: BPhen) was formed to a thickness of 15 nm, so that an electron-transport layer (first electron-transport layer) included in the EL layer 103(1) was formed.

Further, over the first electron-transport layer, a film of lithium oxide ($Li_2O$) was formed by evaporation to a thickness of 0.1 nm to form an electron-injection layer (first electron-injection layer) included in the EL layer 103(1).

After that, over the first electron-injection layer, a film of copper phthalocyanine (abbreviation: CuPc) was formed to a thickness of 2 nm by evaporation, so that an electron relay layer was formed.

Next, over the electron-relay layer, Pn3P and molybdenum(VI) oxide were co-evaporated to form a charge generation layer. The thickness of the charge generation layer was set to 40 nm, and the mass ratio of Pn3P to molybdenum oxide was adjusted to 1:0.5 (=Pn3P:molybdenum oxide).

Next, over the charge generation layer, a film of PCPN was formed to a thickness of 20 nm, thereby forming a hole-transport layer (second hole-transport layer) included in the EL layer 103(2).

Further, 2mDBTPDBq-II, 4-phenyl-4'-(9-phenyl-9H-carbazol-3-yl)triphenylamine (abbreviation: PCBA1BP), and (acetylacetonato)bis(4,6-diphenylpyrimidinato)iridium(III) (abbreviation: [Ir(dppm)$_2$(acac)]) were co-evaporated to form a light-emitting layer (second light-emitting layer) included in the EL layer 103(2) over the second hole-transport layer. Here, the mass ratio of 2mDBTPDBq-II to PCBA1BP and [Ir(dppm)$_2$(acac)] was adjusted to 0.8:0.2: 0.06 (=2mDBTPDBq-II:PCBA1BP:[Ir(dppm)$_2$(acac)]). In addition, the thickness of the second light-emitting layer was set to 40 nm.

Next, over the second light-emitting layer, a film of 2mDBTPDBq-II was formed to a thickness of 15 nm and a film of BPhen was formed to a thickness of 15 nm to form an electron-transport layer (second electron-transport layer) included in the EL layer 103(2).

Further, over the second electron-transport layer, a film of LiF was formed to a thickness of 1 nm by evaporation, thereby forming the electron-injection layer (second electron-injection layer) included in the EL layer 103(2).

Lastly, over the second electron-injection layer, an aluminum film was formed to a thickness of 200 nm by evaporation to form the cathode 102 included in the EL layer 103(2). Thus, the light-emitting element 3 of this example was fabricated.

Note that, in all the above evaporation steps, evaporation was performed by a resistance-heating method.

Table 8 shows element structures of the light-emitting element 3 obtained as described above.

TABLE 8

| Anode ITSO 110 nm | | | | | | | |
|---|---|---|---|---|---|---|---|
| First hole-injection layer | First hole-transport layer | First light-emitting layer | First electron transport layer | | First electron injection layer | Electron relay layer | |
| Pn3P:MoOx (=1:0.5) 33 nm | PCPN 30 nm | CzPA:1,6mMemFLPAPrn (=1:0.05) 30 nm | CzPA 5 nm | Bphen 15 nm | Li$_2$O 0.1 nm | CuPc 2 nm | |
| Charge generation layer | Second hole-transport layer | Second light-emitting layer | Second electron transport layer | | Second electron injection layer | | Cathode |
| Pn3P:MoOx (=1:0.5) 40 nm | PCPN 20 nm | 2mDBTPDBq-II:PCBA1BP: Ir(dppm)$_2$(acac) (=0.8:0.2:0.06) 40 nm | 2mDBTPDBq-II 15 nm | Bphen 15 nm | LiF 1 nm | | Al 200 nm |

In a glove box containing a nitrogen atmosphere, the fabricated light-emitting element 3 was sealed so as not to be exposed to the air.

(Operation Characteristics of Light-Emitting Element 3)

Operation characteristics of the fabricated light-emitting element 3 were measured. Note that the measurements were carried out at room temperature (in an atmosphere kept at 25° C.).

Figure 18:
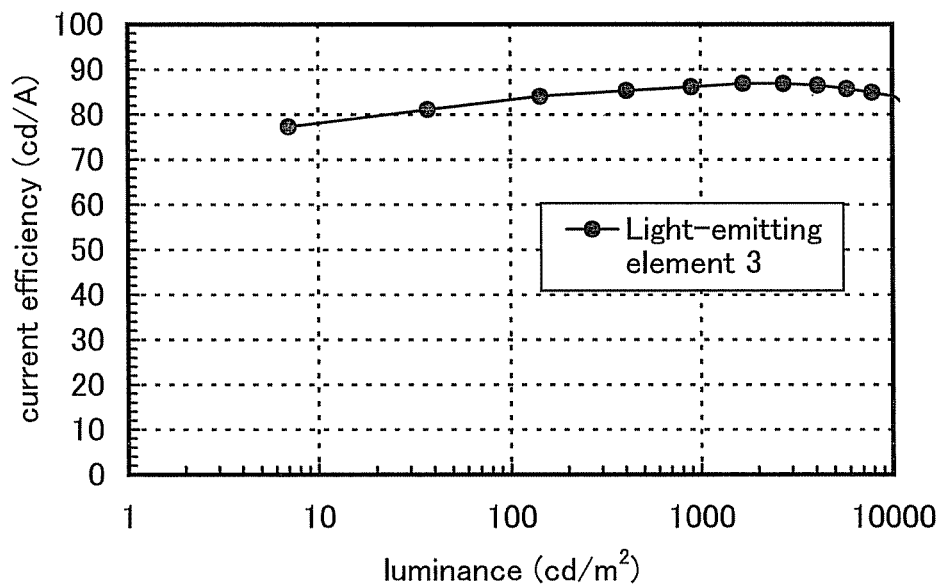
FIG. 18 shows current efficiency versus luminance characteristics of a light-emitting element 3.
Figure 19:
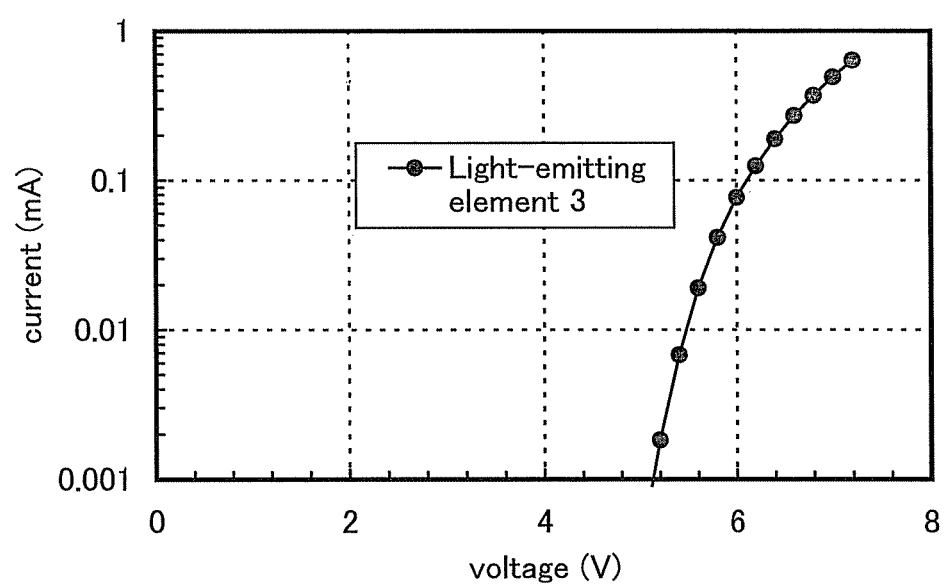
FIG. 19 shows current versus voltage characteristics of the light-emitting element 3.
Figure 20:
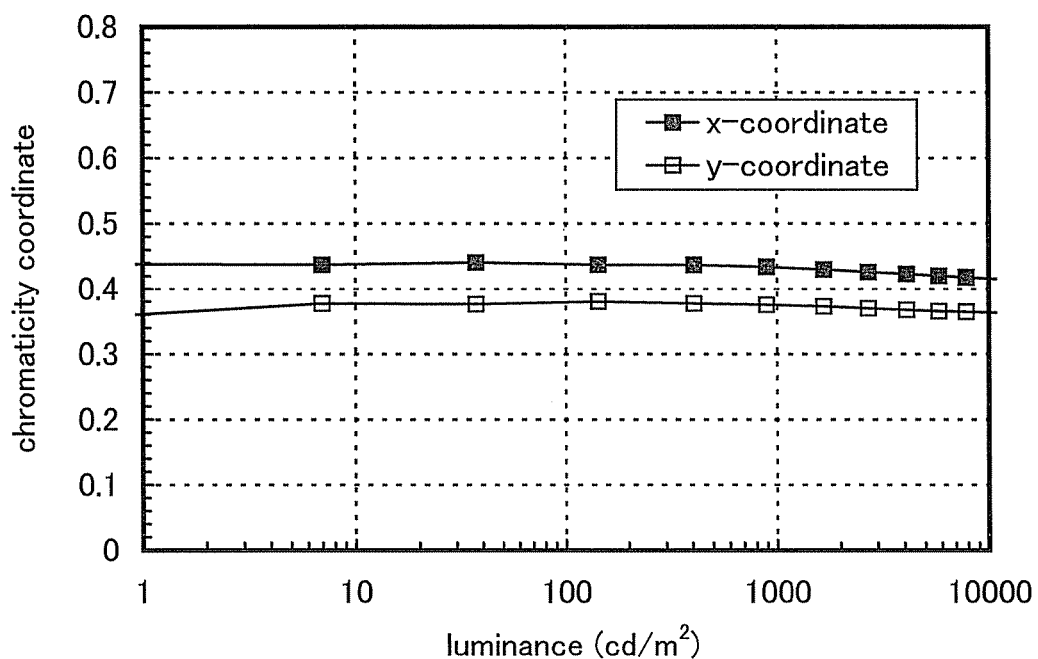
FIG. 20 shows chromaticity coordinate versus luminance characteristics of the light-emitting element 3.
Figure 21:
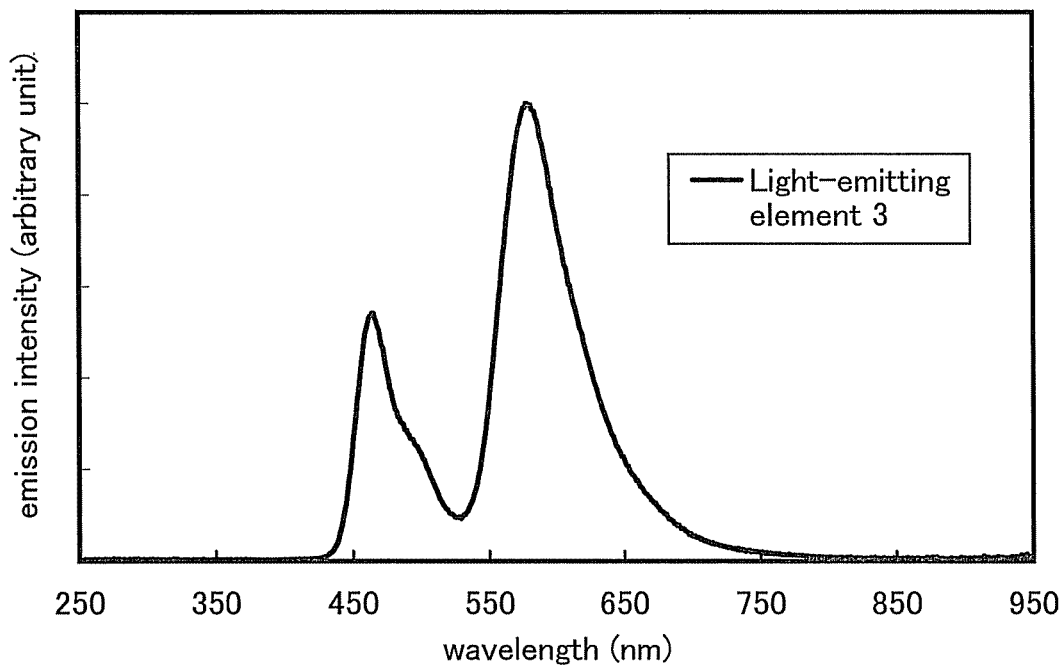
FIG. 21 shows an emission spectrum of the light-emitting element 3.

The current efficiency versus luminance characteristics of the light-emitting element 3 are shown in FIG. 18. In FIG. 18, the horizontal axis represents luminance (cd/m$^2$) and the vertical axis represents current efficiency (cd/A). The current versus voltage characteristics of the element are shown in FIG. 19. In FIG. 19, the horizontal axis represents voltage (V) and the vertical axis represents current (mA). The chromaticity coordinate versus luminance characteristics of the element are shown in FIG. 20. In FIG. 20, the horizontal axis represents luminance (cd/m$^2$) and the vertical axis represents chromaticity coordinate (the x-coordinate or the y-coordinate). FIG. 21 shows an emission spectrum of the light-emitting element 3 which was obtained when a current of 0.1 mA was made to flow in the light-emitting element 3. In FIG. 21, the horizontal axis represents wavelength (nm) and the vertical axis represents emission intensity (an arbitrary unit). Further, Table 9 shows the voltage (V), CIE chromaticity coordinates (x, y), current efficiency (cd/A), external quantum efficiency (%), and correlated color temperature (K) of the light-emitting element 3 at a luminance of 890 cd/m$^2$.

TABLE 9

| | Voltage (V) | Chromaticity coordinates (x, y) | Current efficiency (cd/A) | External quantum efficiency (%) | Correlated color temperature (K) |
|---|---|---|---|---|---|
| Light-emitting element 3 | 5.8 | (0.43, 0.38) | 86 | 36 | 2800 |

As shown in Table 9, the CIE chromaticity coordinates of the light-emitting element 3 are (x, y)=(0.43, 0.38) at a luminance of 890 cd/m$^2$. Further, FIG. 21 indicates that, in the light-emitting element 3, the blue light-emitting material (1,6mMemFLPAPrn) and the orange light-emitting material ([Ir(dppm)$_2$(acac)]) emit light with a good balance. In addition, FIG. 20 shows that the light-emitting element 3 undergoes a small change in chromaticity which depends on luminance, indicating its excellent carrier balance.

As can be seen from FIG. 18 and FIG. 19, the light-emitting element 3 has a low driving voltage and high emission efficiency.

The above results suggest that a light-emitting element having high emission efficiency or a light-emitting element having a low driving voltage can be achieved because a composite material in which charge-transfer interaction does not occur easily is used for the charge generation layer and hole-injection layer of the light-emitting element.

Example 4

In this example, a light-emitting element of one embodiment of the present invention is described with reference to FIG. 5. Structural formulae of materials used in this example are illustrated below; however, structural formulae of the materials given in the above embodiment or example are omitted here.

A method of fabricating a light-emitting element 4 of this example is described below.

(Fabrication of Light-Emitting Element 4)

First, a film of ITSO was formed over a glass substrate by a sputtering method, so that the anode 101 was formed. The thickness thereof was 110 nm and the electrode area was 2 mm×2 mm.

In pretreatment for forming the light-emitting element over the glass substrate, UV ozone treatment was performed for 370 seconds after washing of a surface of the glass substrate with water and baking that was performed at 200° C. for 1 hour.

After that, the glass substrate was transferred into a vacuum evaporation apparatus where the pressure had been reduced to approximately 10$^{-4}$ Pa, and was subjected to vacuum baking at 170° C. for 30 minutes in a heating chamber of the vacuum evaporation apparatus, and then the glass substrate was cooled down for about 30 minutes.

Next, the glass substrate provided with the anode 101 was fixed to a substrate holder in the vacuum evaporation apparatus so that the surface over which the anode 101 was provided faced downward. The pressure in the vacuum evaporation apparatus was reduced to about 10$^{-4}$ Pa. Then, over the anode 101, DBT3P-II and molybdenum(VI) oxide were co-evaporated to form a hole-injection layer (first hole-injection layer) included in the EL layer 103(1). The thickness of the first hole-injection layer was set to 50 nm, and the mass ratio of DBT3P-II to molybdenum oxide was adjusted to 4:2 (=DBT3P-II:molybdenum oxide).

Next, over the first hole-injection layer, a film of PCPN was formed to a thickness of 10 nm, thereby forming a hole-transport layer (first hole-transport layer) included in the EL layer 103(1).

Furthermore, CzPA and 1,6-FLPAPrn were co-evaporated to form a light-emitting layer (first light-emitting layer) included in the EL layer 103(1) over the first hole-transport layer. Here, the mass ratio of CzPA to 1,6-FLPAPrn was adjusted to 1:0.05 (=CzPA:1,6-FLPAPrn). In addition, the thickness of the first light-emitting layer was set to 30 nm.

Next, over the first light-emitting layer, a film of CzPA was formed to a thickness of 10 nm and a film of BPhen was formed to a thickness of 15 nm, so that an electron-transport layer (first electron-transport layer) included in the EL layer 103(1) was formed.

Further, over the first electron-transport layer, a film of lithium oxide ($Li_2O$) was formed by evaporation to a thickness of 0.1 nm to form an electron-injection layer (first electron-injection layer) included in the EL layer 103(1).

After that, over the first electron-injection layer, a film of copper phthalocyanine (abbreviation: CuPc) was formed to a thickness of 2 nm by evaporation, so that the electron relay layer was formed.

Next, over the electron-relay layer, DBT3P-II and molybdenum(VI) oxide were co-evaporated to form a charge generation layer. The thickness of the charge generation layer was set to 50 nm, and the mass ratio of DBT3P-II to molybdenum oxide was adjusted to 4:2 (=DBT3P-II:molybdenum oxide).

Next, over the charge generation layer, a film of PCPN was formed to a thickness of 10 nm, thereby forming a hole-transport layer (second hole-transport layer) included in the EL layer 103(2).

Further, CzPA and 1,6-FLPAPrn were co-evaporated to form a light-emitting layer (second light-emitting layer) included in the EL layer 103(2) over the second hole-transport layer. Here, the mass ratio of CzPA to 1,6-FLPAPrn was adjusted to be 1:0.05 (=CzPA:1,6-FLPAPrn). The thickness of the second light-emitting layer was set to 30 nm.

Next, Over the second light-emitting layer, a film of CzPA was formed to a thickness of 10 nm and a film of BPhen was formed to a thickness of 15 nm to form an electron-transport layer (second electron-transport layer) included in the EL layer 103(2).

Further, over the second electron-transport layer, a film of LiF was formed to a thickness of 1 nm by evaporation, thereby forming the electron-injection layer (second electron-injection layer) included in the EL layer 103(2).

Lastly, an aluminum film was formed to a thickness of 200 nm by evaporation to form the cathode 102. Thus, the light-emitting element 4 of this example was fabricated.

Note that, in all the above evaporation steps, evaporation was performed by a resistance-heating method.

Table 10 shows element structures of the light-emitting element 4 obtained as described above.

TABLE 10

| Anode ITSO 110 nm | | | | | | |
|---|---|---|---|---|---|---|
| First hole injection layer | First hole-transport layer | First light-emitting layer | First electron transport layer | | First electron injection layer | Electron relay layer |
| DBT3P-II:MoOx (=4:2) 50 nm | PCPN 10 nm | CzPA:1,6-FLPAPrn (=1:0.05) 30 nm | CzPA 10 nm | Bphen 15 nm | $Li_2O$ 0.1 nm | CuPc 2 nm |
| Charge generation layer | Second hole-transport layer | Second light-emitting layer | Second electron-transport layer | | Second electron injection layer | Cathode |
| DBT3P-II:MoOx (=4:2) 50 nm | PCPN 10 nm | CzPA:1,6-FLPAPrn (=1:0.05) 30 nm | 2mDBTPDBq-II 10 nm | Bphen 15 nm | LiF 1 nm | Al 200 nm |

In a glove box containing a nitrogen atmosphere, the fabricated light-emitting element 4 was sealed so as not to be exposed to the air.

(Operation Characteristics of Light-Emitting Element 4)

Operation characteristics of the fabricated light-emitting element 4 were measured. Note that the measurements were carried out at room temperature (in an atmosphere kept at 25° C.).

Figure 22:
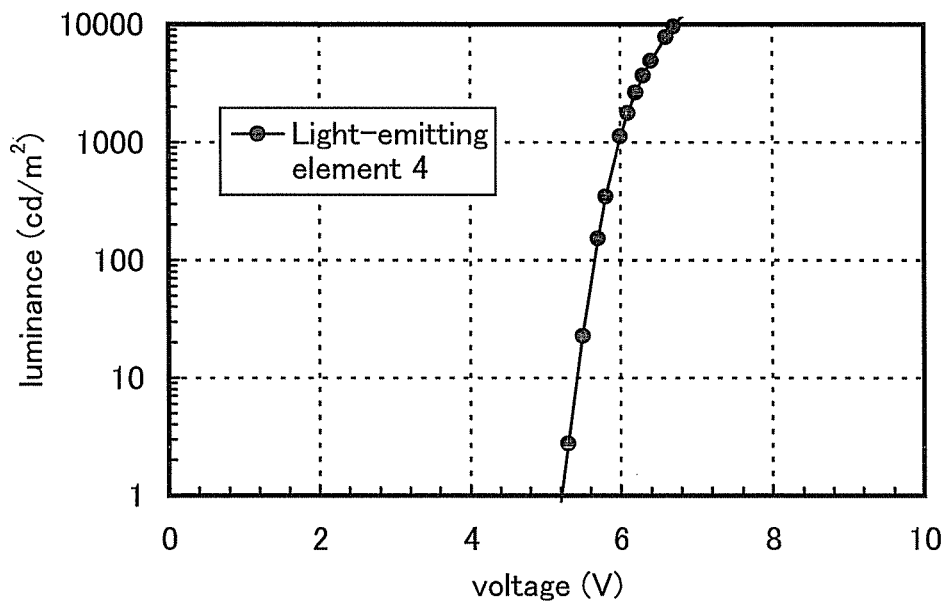
FIG. 22 shows luminance versus voltage characteristics of a light-emitting element 4.
Figure 23:
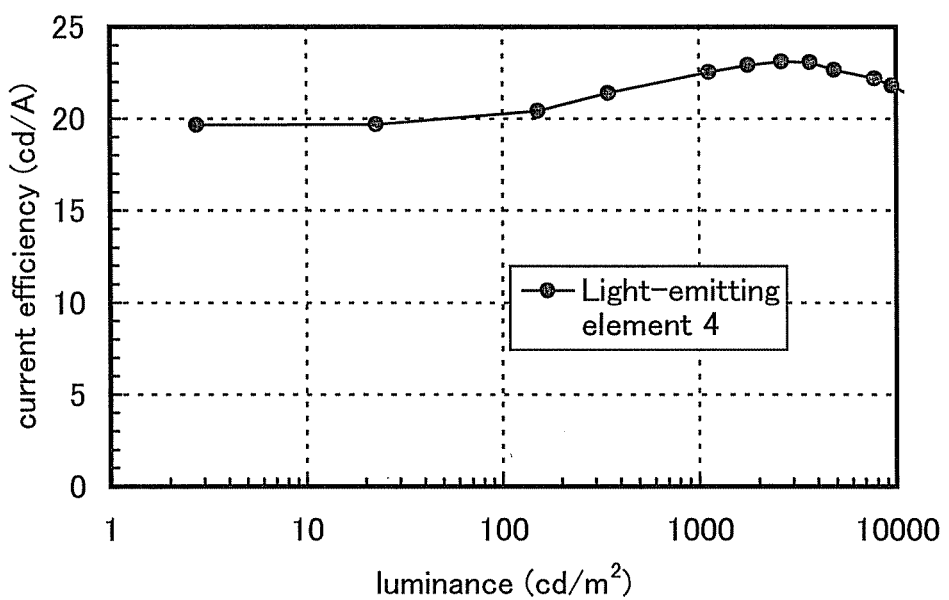
FIG. 23 shows current efficiency versus luminance characteristics of the light-emitting element 4.

The luminance versus voltage characteristics of the light-emitting element 4 are shown in FIG. 22. In FIG. 22, the horizontal axis represents voltage (V) and the vertical axis represents luminance ($cd/m^2$). The current efficiency versus luminance characteristics of the element are shown in FIG. 23. In FIG. 23, the horizontal axis represents luminance ($cd/m^2$) and the vertical axis represents current efficiency (cd/A). Further, Table 11 shows the voltage (V), CIE chromaticity coordinates (x, y), current efficiency (cd/A), power efficiency (lm/W), and external quantum efficiency (%) of the light-emitting element 4 at a luminance of 1130 $cd/m^2$.

TABLE 11

| | Voltage (V) | Chromaticity coordinates (x, y) | Current efficiency (cd/A) | External quantum efficiency (%) | Power efficiency (lm/W) |
|---|---|---|---|---|---|
| Light-emitting element 4 | 6.0 | (0.14, 0.20) | 23 | 16 | 12 |

As shown in Table 11, the CIE chromaticity coordinates of the light-emitting element 4 are (x, y)=(0.14, 0.20) at a luminance of 1130 $cd/m^2$.

As can be seen from FIG. 22 and FIG. 23, the light-emitting element 4 has a low driving voltage and high emission efficiency.

The above results suggest that a light-emitting element having high emission efficiency or a light-emitting element having a low driving voltage can be achieved because a composite material in which charge-transfer interaction does not occur easily is used for the charge generation layer and hole-injection layer of the light-emitting element.

Example 5

In this example, a light-emitting element 5 in which 1,3,5-tri(dibenzofuran-4-yl)benzene (abbreviation: DBF3P-II) and molybdenum(VI) oxide were used for a hole-injection layer is described with reference to FIG. 1.
(Fabrication of Light-Emitting Element 5)

First, a film of indium tin oxide containing silicon oxide (ITSO) was formed over a glass substrate by a sputtering method, so that the anode 101 was formed. The thickness thereof was 110 nm and the electrode area was 2 mm×2 mm.

In pretreatment for forming the light-emitting element over the glass substrate, UV ozone treatment was performed for 370 seconds after washing of a surface of the glass substrate with water and baking that was performed at 200° C. for 1 hour.

After that, the glass substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the glass substrate was cooled down for about 30 minutes.

Next, the glass substrate provided with the anode 101 was fixed to a substrate holder in the vacuum evaporation apparatus so that the surface over which the anode 101 was provided faced downward. The pressure in the vacuum evaporation apparatus was reduced to about $10^{-4}$ Pa. Then, over the anode 101, DBF3P-II and molybdenum(VI) oxide were co-evaporated to form a hole-injection layer 104. The thickness of the hole-injection layer 104 was set to 50 nm, and the mass ratio of DBF3P-II to molybdenum oxide was adjusted to 4:2 (=DBF3P-II:molybdenum oxide).

Next, over the hole-injection layer 104, a film of 3-[4-(9-phenanthryl)-phenyl]-9-phenyl-9H-carbazole (abbreviation: PCPPn) was formed to a thickness of 10 nm, thereby forming the hole-transport layer 105.

Furthermore, 9-[4-(N-carbazolyl)]phenyl-10-phenylanthracene (abbreviation: CzPA) and N,N'-bis[4-(9-phenyl-9H-fluoren-9-yl)phenyl]-N,N'-diphenylpyrene-1,6-diamine (abbreviation: 1,6-FLPAPrn) were co-evaporated to form the light-emitting layer 106 over the hole-transport layer 105. Here, the mass ratio of CzPA to 1,6-FLPAPrn was adjusted to 1:0.05 (=CzPA:1,6-FLPAPrn). In addition, the thickness of the light-emitting layer 106 was set to 30 nm.

Further, over the light-emitting layer 106, a film of CzPA was formed to a thickness of 10 nm and then a film of bathophenanthroline (abbreviation: BPhen) was formed to a thickness of 15 nm, so that the electron-transport layer 107 was formed.

Further, over the electron-transport layer 107, a film of lithium fluoride (LiF) was formed to a thickness of 1 nm by evaporation, thereby forming the electron-injection layer 108.

Lastly, over the electron-injection layer 108, an aluminum film was formed to a thickness of 200 nm by evaporation to form the cathode 102. Thus, the light-emitting element 5 of this example was fabricated.

Note that, in all the above evaporation steps, evaporation was performed by a resistance-heating method.

Table 12 shows element structures of the light-emitting element 5 obtained as described above.

TABLE 12

| | Anode | Hole-injection layer | Hole transport layer | Light-emitting layer | Electron transport layer | Electron injection layer | Cathode |
|---|---|---|---|---|---|---|---|
| Light-emitting element 5 | ITSO 110 nm | DBF3P-II:MoOx (=4:2) 50 nm | PCPPn 10 nm | CzPA:1,6FLPAPrn (=1:0.05) 30 nm | CzPA 10 nm / BPhen 15 nm | LiF 1 nm | Al 200 nm |

In a glove box containing a nitrogen atmosphere, the fabricated light-emitting element 5 was sealed so as not to be exposed to the air.
(Operation Characteristics of Light-Emitting Element 5)

Operation characteristics of the fabricated light-emitting element 5 were measured. Note that the measurements were carried out at room temperature (in an atmosphere kept at 25° C.).

Figure 24:
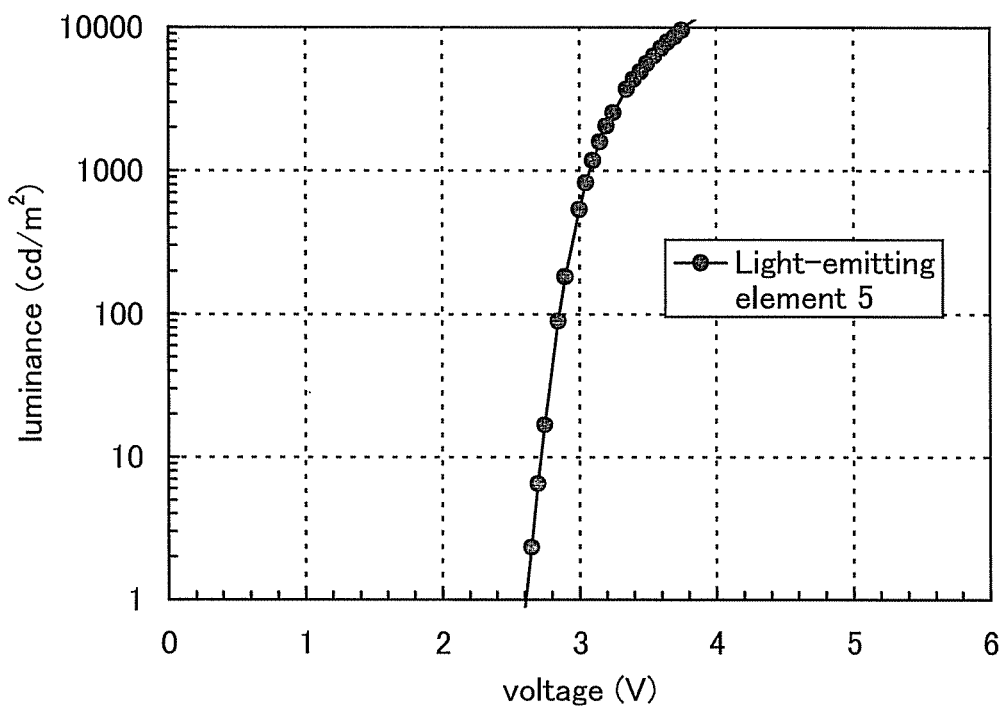
FIG. 24 shows luminance versus voltage characteristics of a light-emitting element 5.
Figure 25:
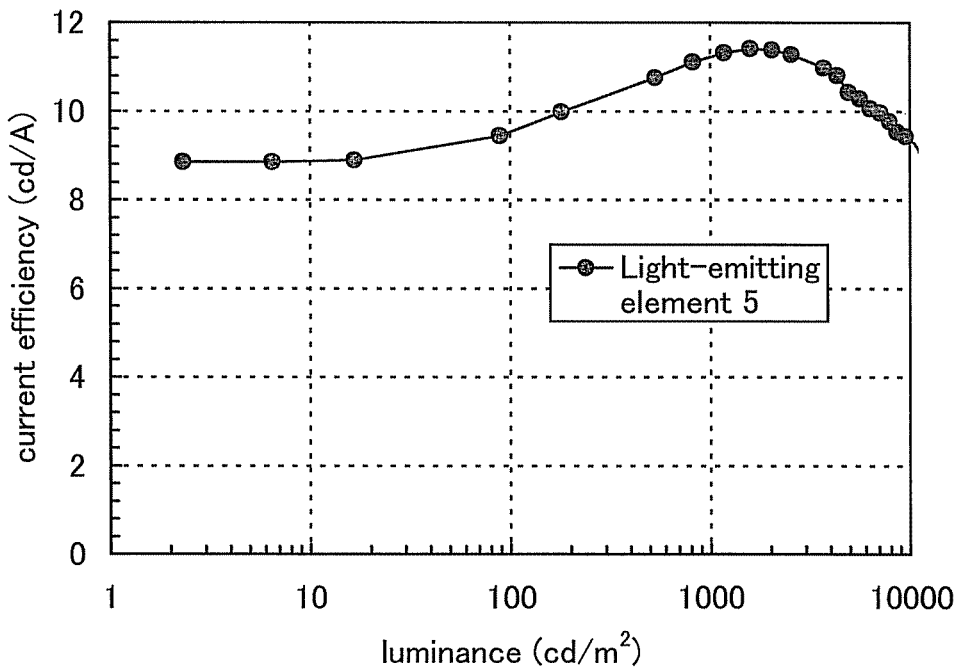
FIG. 25 shows current efficiency versus luminance characteristics of the light-emitting element 5.

The luminance versus voltage characteristics of the light-emitting element 5 are shown in FIG. 24, and the current efficiency versus luminance characteristics of the element are shown in FIG. 25. In FIG. 24, the horizontal axis represents voltage (V) and the vertical axis represents luminance ($cd/m^2$). In FIG. 25, the horizontal axis represents luminance ($cd/m^2$) and the vertical axis represents current efficiency (cd/A).

The initial values of the main characteristics of the light-emitting element 5 at a luminance of around 1180 $cd/m^2$ are shown in Table 13 below.

TABLE 13

| | Voltage (V) | Chromaticity coordinates (x, y) | Current efficiency (cd/A) | External quantum efficiency (%) | Power efficiency (lm/W) |
|---|---|---|---|---|---|
| Light-emitting element 5 | 3.1 | (0.15, 0.24) | 11 | 7 | 11 |

As shown in Table 13, the CIE chromaticity coordinates of the light-emitting element 5 are (x, y)=(0.15, 0.24) at a luminance of 1180 $cd/m^2$. These results show that blue light emission originating from 1,6-FLPAPrn was obtained from the light-emitting element 5.

As can be seen from FIG. 24 and FIG. 25, the light-emitting element 5 has a low driving voltage and high emission efficiency.

The above results suggest that a light-emitting element having high emission efficiency or a light-emitting element having a low driving voltage can be achieved because a composite material in which charge-transfer interaction does not occur easily is used for the hole-injection layer of the light-emitting element.

This application is based on Japanese Patent Application Serial No. 2011-108559 filed with the Japan Patent Office on May 13, 2011 and Japanese Patent Application Serial No. 2011-123451 filed with the Japan Patent Office on Jun. 1, 2011, the entire contents of which are hereby incorporated by reference.

What is claimed is:

1. A light-emitting element comprising:
a first electrode;
a hole-injection layer over and in contact with the first electrode;
a hole-transport layer over the hole-injection layer;
a layer comprising a light-emitting substance over the hole-transport layer; and
a second electrode over the layer,
wherein the hole-injection layer comprises a composite material,
wherein the composite material comprises an organic compound having a hole-transport property and an electron acceptor,
wherein the organic compound comprises at least one of dibenzothiophen and dibenzofuran,
wherein a molar ratio of the electron acceptor to the organic compound is greater than or equal to 1,
wherein an ionization potential of the organic compound is 5.7 eV or more, and
wherein a spin density in the composite material is less than or equal to $3\times10^{19}$ spins/cm$^3$ by an ESR measurement.

2. The light-emitting element according to claim 1, wherein the organic compound comprises at least one of 1,3,5-tri(dibenzothiophen-4-yl)benzene and 1,3,5-tri(dibenzofuran-4-yl)benzene.

3. The light-emitting element according to claim 1, wherein the electron acceptor comprises at least one of vanadium oxide, niobium oxide, tantalum oxide, chromium oxide, molybdenum oxide, tungsten oxide, manganese oxide, and rhenium oxide.

4. A light-emitting device comprising the light-emitting element according to claim 1.

5. A light-emitting element comprising:
a first electrode;
a hole-injection layer over and in contact with the first electrode;
a hole-transport layer over the hole-injection layer;
a layer comprising a light-emitting substance over the hole-transport layer; and
a second electrode over the layer,
wherein the hole-injection layer comprises a composite material,
wherein the composite material comprises an organic compound having a hole-transport property and an electron acceptor,
wherein the organic compound comprises at least one of dibenzothiophen and dibenzofuran,
wherein a molar ratio of the electron acceptor to the organic compound is greater than or equal to 2,
wherein an ionization potential of the organic compound is 5.7 eV or more, and
wherein a spin density in the composite material is less than or equal to $5\times10^{19}$ spins/cm$^3$ by an ESR measurement.

6. The light-emitting element according to claim 5, wherein the organic compound comprises at least one of 1,3,5-tri(dibenzothiophen-4-yl)benzene and 1,3,5-tri(dibenzofuran-4-yl)benzene.

7. The light-emitting element according to claim 5, wherein the electron acceptor comprises at least one of vanadium oxide, niobium oxide, tantalum oxide, chromium oxide, molybdenum oxide, tungsten oxide, manganese oxide, and rhenium oxide.

8. A light-emitting device comprising the light-emitting element according to claim 5.

9. A light-emitting element comprising:
a first electrode;
a first layer comprising a light-emitting substance over the first electrode;
a charge generation layer over the first layer;
a second layer comprising a light-emitting substance over the charge generation layer; and
a second electrode over the second layer,
wherein the charge generation layer comprises a composite material,
wherein the composite material comprises an organic compound having a hole-transport property and an electron acceptor,
wherein the organic compound comprises at least one of dibenzothiophen and dibenzofuran,
wherein a molar ratio of the electron acceptor to the organic compound is greater than or equal to 1,
wherein an ionization potential of the organic compound is 5.7 eV or more, and
wherein a spin density in the composite material is less than or equal to $3\times10^{19}$ spins/cm$^3$ by an ESR measurement.

10. The light-emitting element according to claim 9, wherein the organic compound comprises at least one of 1,3,5-tri(dibenzothiophen-4-yl)benzene and 1,3,5-tri(dibenzofuran-4-yl)benzene.

11. The light-emitting element according to claim 9, wherein the electron acceptor comprises at least one of vanadium oxide, niobium oxide, tantalum oxide, chromium oxide, molybdenum oxide, tungsten oxide, manganese oxide, and rhenium oxide.

12. A light-emitting device comprising the light-emitting element according to claim 9.

13. A light-emitting element comprising:
a first electrode;
a first layer comprising a light-emitting substance over the first electrode;
a charge generation layer over the first layer;
a second layer comprising a light-emitting substance over the charge generation layer; and
a second electrode over the second layer,
wherein the charge generation layer comprises a composite material,
wherein the composite material comprises an organic compound having a hole-transport property and an electron acceptor,
wherein the organic compound comprises at least one of dibenzothiophen and dibenzofuran,
wherein a molar ratio of the electron acceptor to the organic compound is greater than or equal to 2,
wherein an ionization potential of the organic compound is 5.7 eV or more, and
wherein a spin density in the composite material is less than or equal to $5\times10^{19}$ spins/cm$^3$ by an ESR measurement.

14. The light-emitting element according to claim 13, wherein the organic compound comprises at least one of 1,3,5-tri(dibenzothiophen-4-yl)benzene and 1,3,5-tri(dibenzofuran-4-yl)benzene.

15. The light-emitting element according to claim 13, wherein the electron acceptor comprises at least one of vanadium oxide, niobium oxide, tantalum oxide, chromium oxide, molybdenum oxide, tungsten oxide, manganese oxide, and rhenium oxide.

16. A light-emitting device comprising the light-emitting element according to claim 13.

* * * * *